(12) United States Patent
Ishimaru et al.

(10) Patent No.: US 12,224,115 B2
(45) Date of Patent: Feb. 11, 2025

(54) CIRCUIT DEVICE AND SOLENOID CONTROL DEVICE

(71) Applicant: SEIKO EPSON CORPORATION, Tokyo (JP)

(72) Inventors: Kei Ishimaru, Chino (JP); Yoshihiko Nimura, Hara (JP)

(73) Assignee: SEIKO EPSON CORPORATION (JP)

( * ) Notice: Subject to any disclaimer, the term of this patent is extended or adjusted under 35 U.S.C. 154(b) by 167 days.

(21) Appl. No.: 18/170,915

(22) Filed: Feb. 17, 2023

(65) Prior Publication Data

US 2023/0268109 A1 Aug. 24, 2023

(30) Foreign Application Priority Data

Feb. 18, 2022 (JP) .................................. 2022-023366
Feb. 18, 2022 (JP) .................................. 2022-023367
Feb. 18, 2022 (JP) .................................. 2022-023368

(51) Int. Cl.
*H01F 7/06* (2006.01)
*H03F 3/45* (2006.01)
*H03K 19/0175* (2006.01)

(52) U.S. Cl.
CPC ......... *H01F 7/064* (2013.01); *H03F 3/45475* (2013.01); *H03K 19/017509* (2013.01)

(58) Field of Classification Search
CPC .............................. H01F 7/064; H03F 3/45475
See application file for complete search history.

(56) References Cited

U.S. PATENT DOCUMENTS

| 5,568,054 A * | 10/1996 | Iino .................... G01R 31/2868 324/750.05 |
| 2010/0231187 A1* | 9/2010 | Wicht ................... H02M 3/156 323/282 |
| 2013/0135047 A1 | 5/2013 | Danioni |
| 2019/0013750 A1 | 1/2019 | Leman et al. |
| 2021/0003615 A1 | 1/2021 | Sasaki et al. |

FOREIGN PATENT DOCUMENTS

| JP | 2010-170434 A | 8/2010 |
| JP | 2017-161409 A | 9/2017 |

OTHER PUBLICATIONS

U.S. Appl. No. 17/706,924, filed Mar. 29, 2022, Toshimichi Yamada.

* cited by examiner

*Primary Examiner* — Jared Fureman
*Assistant Examiner* — Christopher J Clark
(74) *Attorney, Agent, or Firm* — Harness, Dickey & Pierce, P.L.C.

(57) ABSTRACT

A current sense amplifier circuit of a circuit device includes: an operational amplifier; a first resistor provided between one end of a shunt resistor and a first node, a first switch provided between the first node and a first input node, a second resistor provided between another end of the shunt resistor and a second node, a second switch provided between the second node and a second input node, a third resistor provided between a constant voltage node and the third node, a third switch provided between the third node and the first input node, a fourth resistor provided between the constant voltage node and a fourth node, and a fourth switch provided between the fourth node and the second input node.

9 Claims, 19 Drawing Sheets

CIRCUIT DEVICE AND SOLENOID CONTROL DEVICE

The present application is based on, and claims priority from JP Application Serial Number 2022-023366, filed Feb. 18, 2022, JP Application Serial Number 2022-023367, filed Feb. 18, 2022, and JP Application Serial Number 2022-023368, filed Feb. 18, 2022, the disclosures of which are hereby incorporated by reference herein in their entireties.

BACKGROUND

1. Technical Field

The present invention relates to a circuit device and a solenoid control device.

2. Related Art

JP-A-2010-170434 (Patent Literature 1) discloses a current control device for a solenoid. The current control device includes a first current monitoring circuit configured to detect a value of a current flowing through the solenoid and feed back the value of the current to a current control circuit of the solenoid, and a second current monitoring circuit provided in parallel with the first current monitoring circuit and configured to detect a value of a current flowing through the solenoid and feed back the value of the current to the current control circuit of the solenoid. When the second current monitoring circuit detects the value of the current flowing through the solenoid, the first current monitoring circuit calibrates an offset. The first current monitoring circuit includes a switch that short-circuits both ends of a current detection resistor during offset detection.

JP-A-2017-161409 (Patent Literature 2) discloses a voltage detection device. The voltage detection device includes a first switch configured to turn on and turn off an input of a voltage to a first input unit, a second switch configured to turn on and turn off an input of a voltage to a second input unit, a third switch configured to turn on and turn off coupling between the first input unit and the second input unit, and a control device. The first input unit is coupled to one end of a shunt resistor, and the second input unit is coupled to the other end of the shunt resistor. The control device detects an offset voltage of a differential amplifier circuit when the first switch and the second switch are turned off and the third switch is turned on.

In Patent Literatures 1 and 2, a switch that couples both ends of a shunt resistor is provided, and the both ends of the shunt resistor are short-circuited when the switch is turned on during offset detection. Voltages at both ends of the shunt resistor are input to the switch, and therefore, when a high voltage or a negative voltage is input to one end or the other end of the shunt resistor, it is necessary to provide a switch that withstands these voltages.

SUMMARY

An aspect of the present disclosure relates to a circuit device. The circuit device includes: a current sense amplifier circuit configured to detect a current flowing through a shunt resistor among a switching element, the shunt resistor and an inductor coupled in series between a first power supply node and a second power supply node; and a processing circuit configured to obtain, based on an output of the current sense amplifier circuit, a corrected current value of the current flowing through the shunt resistor. The current sense amplifier circuit includes an operational amplifier, a first resistor provided between a first resistor node at one end of the shunt resistor and a first node, a first switch provided between the first node and a first input node of the operational amplifier, a second resistor provided between a second resistor node at another end of the shunt resistor and a second node, a second switch provided between the second node and a second input node of the operational amplifier, a third resistor provided between a constant voltage node and a third node, a third switch provided between the third node and the first input node of the operational amplifier, a fourth resistor provided between the constant voltage node and a fourth node, and a fourth switch provided between the fourth node and the second input node of the operational amplifier. In a current detection period, the first switch and the second switch are turned on, the third switch and the fourth switch are turned off, and the processing circuit acquires a detected current value based on the output of the current sense amplifier circuit. In an offset detection period, the first switch and the second switch are turned off, the third switch and the fourth switch are turned on, and the processing circuit acquires an offset value based on the output of the current sense amplifier circuit. The processing circuit obtains the corrected current value based on the detected current value and the offset value.

Another aspect of the present disclosure relates to a solenoid control device. The solenoid control device includes: the circuit device described above; the switching element; the shunt resistor; and a solenoid that is the inductor. The solenoid is controlled based on the corrected current value.

DESCRIPTION OF EXEMPLARY EMBODIMENTS

Hereinafter, preferred embodiments according to the present disclosure will be described in detail. The embodiments to be described below do not unduly limit contents described in the claims, and not all configurations described in the embodiments are necessarily essential constituent elements.

1. Solenoid Control Device and Circuit Device

Figure 1:
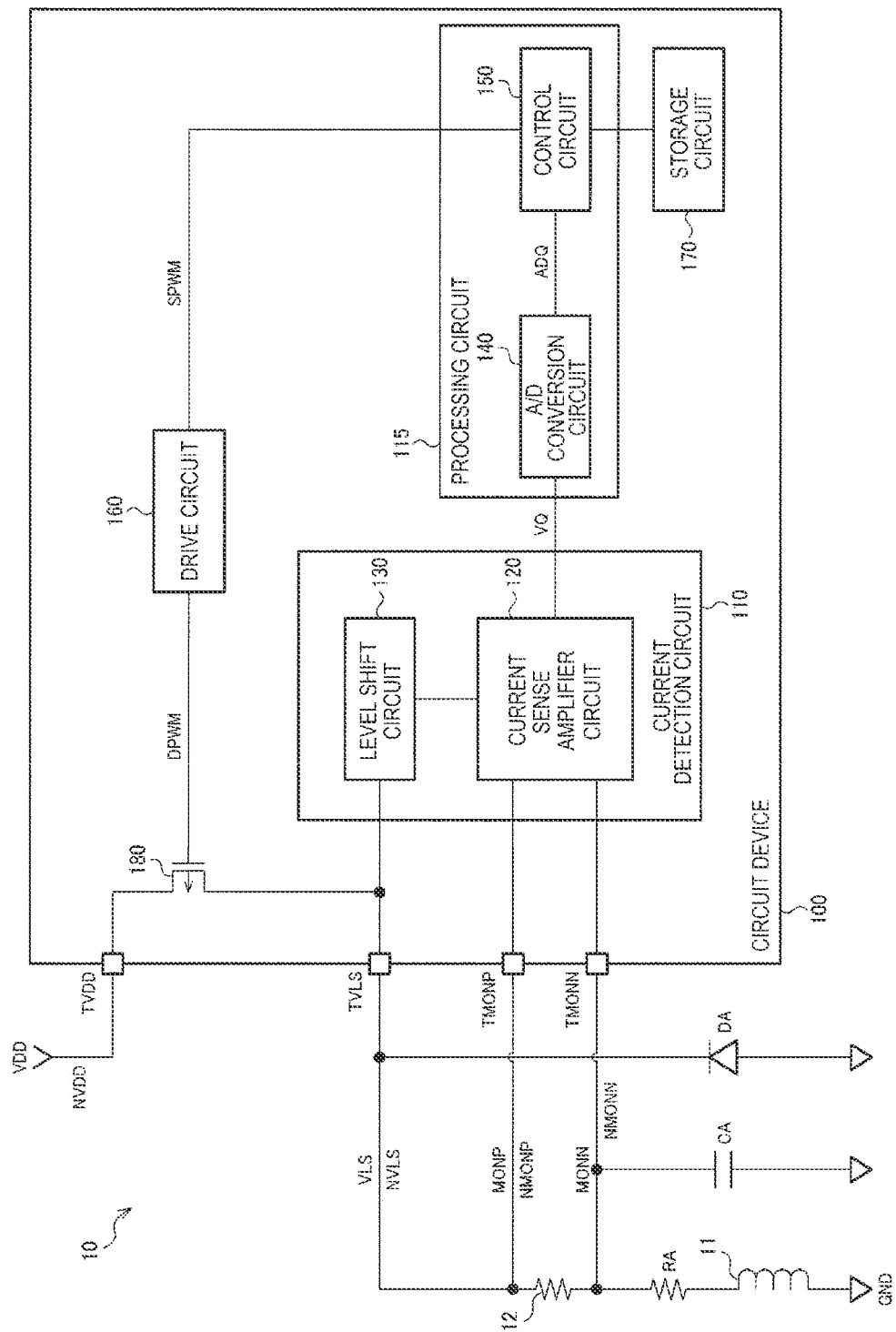
FIG. 1 shows a configuration example of a circuit device and a solenoid control device.

FIG. 1 shows a configuration example of a circuit device and a solenoid control device including the circuit device according to the embodiment. Hereinafter, an example in which the circuit device according to the embodiment is used for solenoid control will be described, but the circuit device according to the embodiment is applicable to various devices configured to detect a current controlled by switching.

A solenoid control device 10 includes a shunt resistor 12, an inductor 11, a resistor RA, a capacitor CA, a diode DA, and a circuit device 100.

The inductor 11 is a coil of a solenoid. The solenoid includes the coil and a plunger that is movable along an axial direction of the coil. The plunger is also referred to as a movable iron core. A displacement amount of the plunger with respect to the coil is controlled by a current flowing through the coil.

The shunt resistor 12, the resistor RA, and the inductor 11 are coupled in series between a node NVLS and a ground node. Specifically, one end of the shunt resistor 12 is coupled to the node NVLS, and the other end thereof is coupled to one end of the resistor RA. The other end of the resistor RA is coupled to one end of the inductor 11. The other end of the inductor 11 is coupled to the ground node.

The diode DA is provided between the node NVLS and the ground node with a direction from the ground node to the resistor node NVLS as a forward direction. Specifically, an anode of the diode DA is coupled to the ground node, and a cathode of the diode DA is coupled to the node NVLS. The capacitor CA is provided in parallel with the resistor RA and the inductor 11. Specifically, one end of the capacitor CA is coupled to one end of the resistor RA, and the other end is coupled to the ground node.

The circuit device 100 detects a current flowing through the inductor 11 and controls the current flowing through the inductor 11 based on the detection result. The circuit device 100 includes a current detection circuit 110, a processing circuit 115, a drive circuit 160, a storage circuit 170, a switching element 180, and terminals TVDD, TVLS, TMONP, and TMONN. The circuit device 100 is, for example, an integrated circuit device in which a plurality of circuit elements are integrated on a semiconductor substrate. Each terminal is, for example, a pad of the integrated circuit device or a terminal of a package accommodating the integrated circuit device. The switching element 180 may be provided outside the circuit device 100.

The switching element 180 is provided between a power supply node NVDD and the node NVLS. Specifically, the switching element 180 is a P-type transistor. A source of the P-type transistor is coupled to the terminal TVDD and a drain thereof is coupled to the terminal TVLS. The power supply node NVDD is coupled to the terminal TVDD, and a power supply voltage VDD is supplied from the outside of the circuit device 100. The node NVLS at the one end of the shunt resistor 12 is coupled to the terminal TVLS.

The current detection circuit 110 detects the current flowing through the inductor 11 by detecting a current flowing through the shunt resistor 12. The current detection circuit 110 includes a current sense amplifier circuit 120 and a level shift circuit 130.

A voltage MONP at the one end of the shunt resistor 12 is input to the current sense amplifier circuit 120 from a first resistor node NMONP via the terminal TMONP, and a voltage MONN at the other end of the shunt resistor 12 is input to the current sense amplifier circuit 120 from a second resistor node NMONN via the terminal TMONN. The first resistor node NMONP is a node coupled to the one end of the shunt resistor 12. The second resistor node NMONN is a node coupled to the other end of the shunt resistor 12. The current sense amplifier circuit 120 detects the current flowing through the shunt resistor 12 by detecting a potential difference between both ends of the shunt resistor 12 based on the voltage MONP and the voltage MONN, and outputs a detected voltage VQ as a result. Two terminals TVLS and TMONP are coupled to the one end of the shunt resistor 12, and a node coupled to the terminal TVLS is referred to as a node NTVLS and a node coupled to the terminal TMOMP is referred to as the resistor node NMONP. Both a voltage VLS and the voltage MONP are voltages at the one end of the shunt resistor 12.

The level shift circuit 130 level-shifts a voltage of an input node of an operational amplifier provided in the current sense amplifier circuit 120 by supplying a current to the input node of the operational amplifier. The level shift circuit 130 keeps the voltage of the input node of the operational amplifier constant by variably controlling the current supplied to the input node of the operational amplifier based on the voltage VLS at the one end of the shunt resistor 12. The details of the current sense amplifier circuit 120 and the level shift circuit 130 will be described later.

The processing circuit 115 outputs, based on the detected voltage VQ, a PWM signal SPWM for PWM control of the switching element 180. The processing circuit 115 includes an A/D conversion circuit 140 and a control circuit 150.

The A/D conversion circuit 140 A/D-converts the detected voltage VQ into detection data ADQ. Specifically, the A/D conversion circuit 140 performs A/D conversion at a sampling frequency higher than a switching frequency of the switching element 180, and acquires the detection data ADQ when the switching element 180 is turned on and the detection data ADQ when the switching element 180 is turned off.

The control circuit 150 outputs, based on the detection data ADQ, the PWM signal SPWM for PWM control of the switching element 180. Specifically, the storage circuit 170 stores a current set value of the current flowing through the inductor 11. The storage circuit 170 is, for example, a volatile memory such as an SRAM, a register, or a non-volatile memory such as an EEPROM. The control circuit 150 smoothens the detection data ADQ to calculate a time average, and controls an on-duty of the switching element 180 such that the average value matches the current set value.

The drive circuit 160 outputs a PWM drive signal DPWM by buffering the PWM signal SPWM. The PWM drive signal DPWM is input to a gate of the P-type transistor, that is, the switching element 180. The current flowing through the inductor 11 is controlled by the on-duty of the switching element 180.

In the circuit device 100 according to the embodiment, the current detection circuit 110 or the processing circuit 115 corrects a detection error of a current value detected by the current sense amplifier circuit 120. The details of this correction will be described with reference to FIG. 4 and subsequent drawings. Hereinafter, a level shift method in the current detection circuit 110 will be described first. The detection error of the current value is not considered in the description of the level-shift method.

2. Level Shift Method

Figure 2:
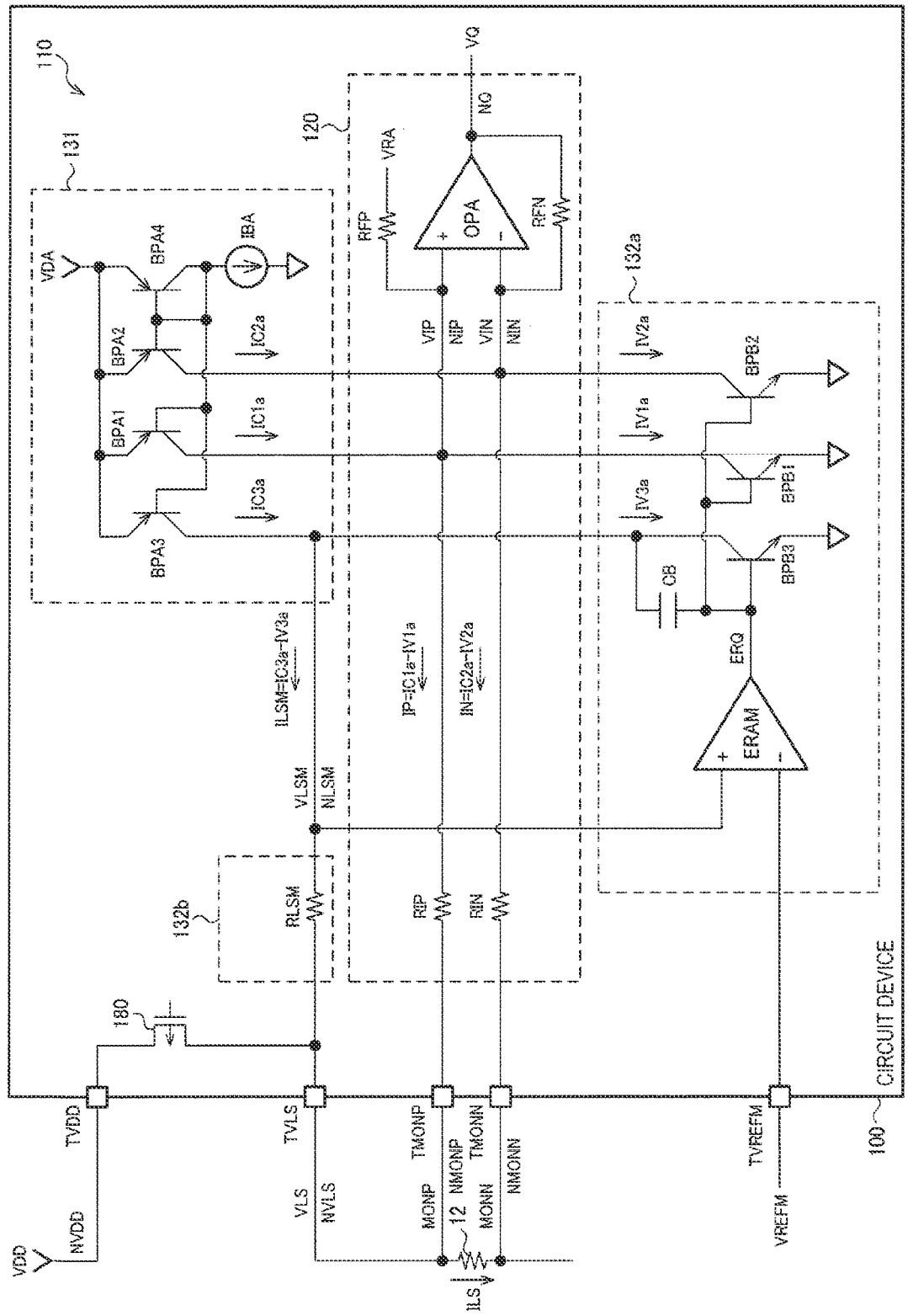
FIG. 2 shows a basic configuration example of a current detection circuit.

FIG. 2 shows a basic configuration example of the current detection circuit that performs level shift. The current detection circuit 110 includes the current sense amplifier circuit 120, a source current source 131, and variable sink current sources 132a and 132b. The source current source 131 and the variable sink current sources 132a and 132b correspond to the level shift circuit 130 in FIG. 1. FIG. 2 shows an example in which a reference voltage VREFM is input to a terminal TVREFM from the outside of the circuit device 100, but the present disclosure is not limited thereto, and a voltage generation circuit provided in the circuit device 100 may generate the reference voltage VREFM.

The current sense amplifier circuit 120 includes a first resistor RIP, a second resistor RIN, a resistor RFP, a feedback resistor RFN, and an operational amplifier OPA.

The first resistor RIP is provided between the terminal TMONP and a first input node NIP. One end of the resistor RFP is coupled to the first input node NIP, and an analog ground voltage VRA is input to the other end of the resistor RFP. The analog ground voltage VRA is input to the other end of the resistor RFP from a voltage generation circuit (not shown). The second resistor RIN is provided between the terminal TMONN and a second input node NIN. One end of the feedback resistor RFN is coupled to the second input node NIN and the other end thereof is coupled to an output node NQ of the operational amplifier OPA. The first input node NIP is a non-inverting input node of the operational amplifier OPA, and the second input node NIN is an inverting input node of the operational amplifier OPA. Resistance values of the first resistor RIP and the second resistor RIN are the same, and resistance values of the resistor RFP and the feedback resistor RFN are the same. However, as will be described later, the resistance values of the first resistor RIP and the second resistor RIN may have mismatches due to manufacturing variations or the like. A gain of the current sense amplifier circuit 120 is, for example, several times to several tens of times, but is not limited thereto.

The current flowing through the shunt resistor 12 is referred to as ILS, and a resistance value of the shunt resistor 12 is referred to as Rsh. In this case, a potential difference Vsh at both ends of the shunt resistor 12 is given by the following equation (1), and the detected voltage VQ of the current sense amplifier circuit 120 is given by the following equation (2).

$$Vsh = MONP - MONN = Rsh \times ILS \quad (1)$$

$$VQ = (RFN/RIN) \times Vsh + VRA \quad (2)$$

The source current source 131 and the variable sink current sources 132a and 132b, that is, the level shift circuit 130, cause a first current IP to flow through the first resistor RIP and cause a second current IN to flow through the second resistor. When directions of arrows of IP and IN shown in FIG. 2 are positive directions of the currents, a level shift amount ΔVIP of a voltage VIP of the first input node NIP and a level shift amount ΔVIN of a voltage VIN of the second input node NIN are given by the following equation (3). VIP' and VIN' are voltages of input nodes of the operational amplifier OPA when the currents IP and IN do not flow.

$$\Delta VIP = VIP - VIP' = RIP \times IP,$$

$$\Delta VIN = VIN - VIN' = RIN \times IN \quad (3)$$

Since VIP'=VIN' and VIP=VIN due to virtual short, ΔVIP=ΔVIN. Since RIP=RIN, the level shift circuit 130 outputs a current IP=IN.

As shown in the following equation (4), the level shift circuit 130 outputs variable currents IP and IN according to a voltage VLS=MONP.

$$IP = IN = (VREFM - VLS)/RIP \quad (4)$$

Based on the above equations (3) and (4), the level shift amounts ΔVIP and ΔVIN are given by the following equation (5), and the voltages VIP and VIN of the input nodes of the operational amplifier OPA are given by the following equation (6).

$$\Delta VIP = \Delta VIN = VREFM - VLS \quad (5)$$

$$VIP = VIN = VIP' + \Delta VIP = VIP' - VLS + VREFM \quad (6)$$

When the gain of the current sense amplifier circuit 120 is sufficiently high, the voltage VIP' is substantially the same as the voltage VLS, and thus the voltages VIP and VIN of the input nodes of the operational amplifier OPA are substantially the same as the reference voltage VREFM.

More specifically, the source current source 131 includes PNP-type bipolar transistors BPA1 to BPA4 and a current source IBA.

Emitters of the bipolar transistors BPA1 to BPA4 are coupled to a node of a power supply voltage VDA. The power supply voltage VDA is supplied from, for example, a power supply circuit provided in the circuit device 100. A collector of the bipolar transistor BPA1 is coupled to the first input node NIP of the operational amplifier OPA, a collector of the bipolar transistor BPA2 is coupled to the second input node NIN of the operational amplifier OPA, and a collector of the bipolar transistor BPA3 is coupled to a node NLSM. Bases of the bipolar transistors BPA1 to BPA3 are coupled to a base and a collector of the bipolar transistor BPA4. A current to flow from the current source IBA is a current of the collector of the bipolar transistor BPA4, and the current of the collector is mirrored by the bipolar transistors BPA1 to BPA3 and constant currents IC1a to IC3a are output from the collector. The constant currents IC1a to IC3a are source currents, and IC1a=IC2a=IC3a.

The variable sink current source 132 includes a resistor RLSM, an error amplifier circuit ERAM, NPN-type bipolar transistors BPB1 to BPB3, and a capacitor CB.

The resistor RLSM is provided between the node NVLS and the node NLSM.

The capacitor CB is provided between an output node of the error amplifier circuit ERAM and the node NLSM. Specifically, one end of the capacitor CB is coupled to the output node of the error amplifier circuit ERAM, and the other end is coupled to the node NLSM.

Emitters of the bipolar transistors BPB1 to BPB3 are coupled to the ground node. A collector of the bipolar transistor BPB1 is coupled to the first input node NIP of the operational amplifier OPA, a collector of the bipolar transistor BPB2 is coupled to the second input node NIN of the operational amplifier OPA, and a collector of the bipolar transistor BPB3 is coupled to the node NLSM.

The reference voltage VREFM is input to the inverting input node of the error amplifier circuit ERAM from the terminal TVREFM, a voltage VLSM of the node NVLS is input to the non-inverting input node, and the error amplifier circuit ERAM outputs a current control signal ERQ to the base of the bipolar transistor BPB3. When a current of the collector of the bipolar transistor BPB3 is a variable current IV3$a$, the error amplifier circuit ERAM feedback-controls the variable current IV3$a$ such that VLSM=VREFM. In this case, a current ILSM flowing through the resistor RLSM by the level shift circuit 130 is given by the following equation (7).

$$ILSM=IC3a-IV3a=(VREFM-VLS)/RLSM \quad (7)$$

The current ILSM is a current corresponding to the voltage VLS at the one end of the shunt resistor 12. Since the IC3$a$ is a constant current, the variable current IV3$a$ is variably controlled according to the voltage VLS.

Currents of the collectors of the bipolar transistors BPB1 and BPB2 are variable currents IV1$a$ and IV2$a$. Since the current control signal ERQ is output from the error amplifier circuit ERAM to bases of the bipolar transistors BPB1 and BPB2, IV1$a$=IV2$a$=IV3$a$. That is, the variable currents IV1$a$ and IV2$a$ are currents variably controlled according to the voltage VLS, similar to the variable current IV3$a$. The variable currents IV1$a$ to IV3$a$ are sink currents.

The current IP to flow through the first resistor RIP by the level shift circuit 130 and the current IN to flow through the second resistor RIN by the level shift circuit 130 are given by the following equation (8).

$$IP=IC1a-IV1a,$$

$$IN=IC2a-IV2a \quad (8)$$

Based on IC1$a$=IC2$a$=IC3$a$ and IV1$a$=IV2$a$=IV3$a$ and the above equation (8), the currents IP and IN satisfy the following equation (9).

$$IP=IN=ILSM \quad (9)$$

Based on RIP=RIN=RLSM and the above equation (9), the level shift amounts $\Delta$VIP and $\Delta$VIN are given by the following equation (10).

$$\Delta VIP=\Delta VIN=RIP\times IP=RLSM\times ILSM \quad (10)$$

Figure 3:
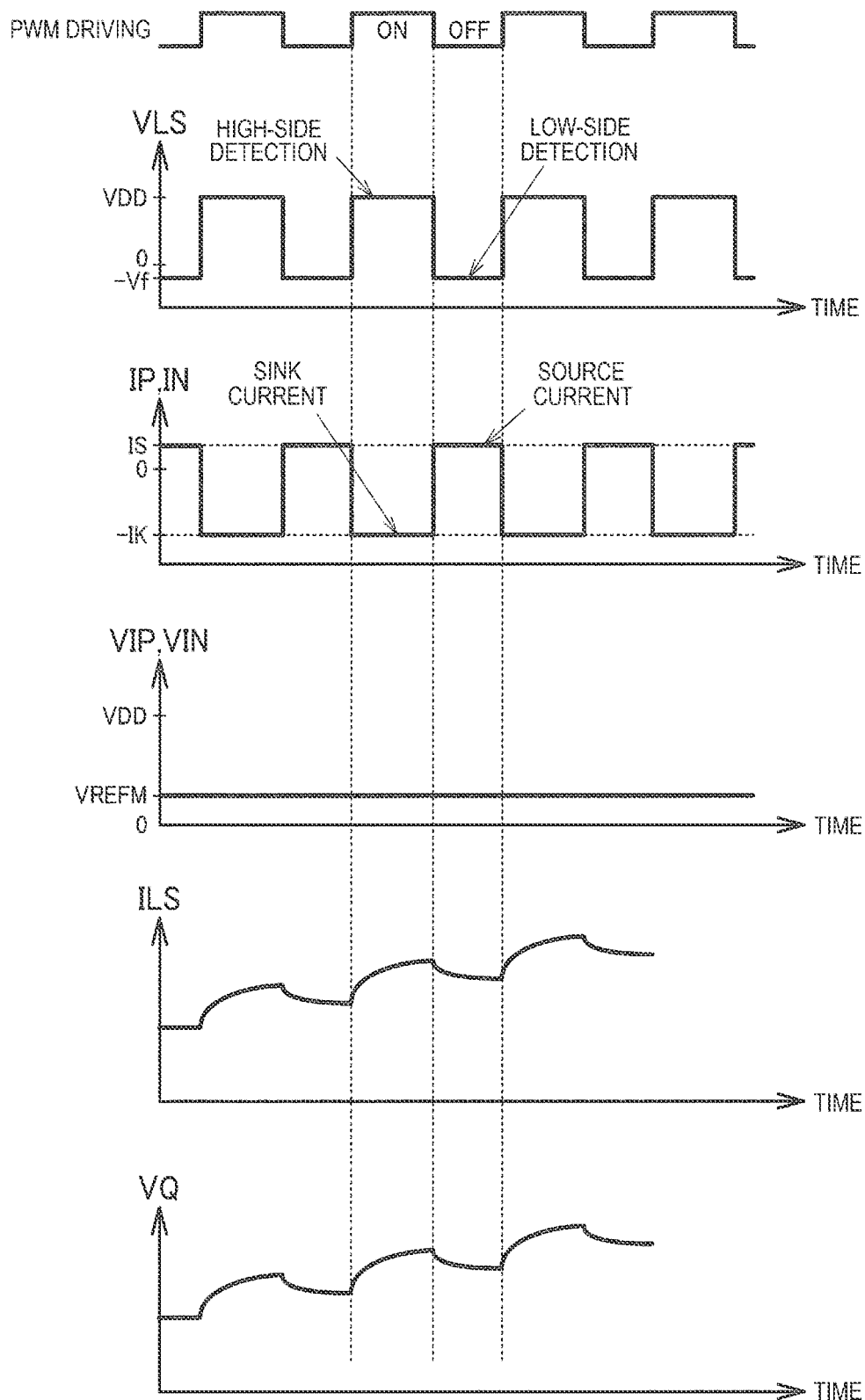
FIG. 3 is a signal waveform diagram showing an operation of the current detection circuit.

FIG. 3 is a signal waveform diagram showing an operation of the current detection circuit 110. First, a basic switching operation will be described.

When the PWM signal SPWM is at a high level and the switching element 180 is turned on, the current ILS flows from the power supply node NVDD to the ground node via the switching element 180, the shunt resistor 12, and the inductor 11. Therefore, the current ILS flowing through the inductor 11 gradually increases. In this case, the voltage at the one end of the shunt resistor 12 is VLS=VDD, and current detection in this case is referred to as high-side detection.

When the PWM signal SPWM is at a low level and the switching element 180 is turned off, the current ILS flows from the ground node to the ground node via the diode DA, the shunt resistor 12, and the inductor 11. Therefore, the current ILS flowing through the inductor 11 gradually decreases. In this case, the voltage at the one end of the shunt resistor 12 is VLS=−Vf, and current detection in this case is referred to as low-side detection. Vf is a forward voltage of the diode DA.

Next, a level shift operation will be described. When the level shift circuit 130 outputs a current to the first resistor RIP and the second resistor RIN, the current is referred to as a source current, and when the level shift circuit 130 draws a current from the first resistor RIP and the second resistor RIN, the current is referred to as a sink current.

Since VLS=VDD>VREFM in the high-side detection, the level shift circuit 130 flows IP=IN=−IK, which is a sink current. Based on the above equation (4), the sink current is given by the following equation (11).

$$IK=(VDD-VREFM)/RIP \quad (11)$$

In addition, based on the above equation (5), the level shift amount is given by the following equation (12). Since $\Delta$VIP<0, the voltages VIP and VIN of the input nodes of the operational amplifier OPA are leveled down in the high-side detection.

$$\Delta VIP=\Delta VIN=VREFM-VDD \quad (12)$$

Since VLS=−Vf<VREFM in the low-side detection, the level shift circuit 130 flows IP=IN=IS, which is a source current. Based on the above equation (4), the sink current and the source current are given by the following equation (13).

$$IS=(VREFM+Vf)/RIP \quad (13)$$

In addition, based on the above equation (5), the level shift amount is given by the following equation (14). Since $\Delta$VIP>0, the voltages VIP and VIN of the input nodes of the operational amplifier OPA are leveled up in the low-side detection.

$$\Delta VIP=\Delta VIN=VREFM+Vf \quad (14)$$

Due to the sink current in the above equation (11) and the source current in the above equation (13), the voltages VIP and VIN of the input nodes of the operational amplifier OPA are substantially the same as the reference voltage VREFM in both the high-side detection and the low-side detection. That is, in the high-side detection, the voltages VIP and VIN of the input nodes are leveled down from the power supply voltage VDD to a voltage substantially equal to the reference voltage VREFM, and in the low-side detection, the voltages VIP and VIN of the input nodes are leveled up from the negative voltage −Vf to the voltage substantially equal to the reference voltage VREFM. Accordingly, the high-side detection and the low-side detection can be performed in one current sense amplifier circuit, and an input voltage range of the operational amplifier of the current sense amplifier circuit may be a narrow range near the reference voltage VREFM. In addition, by setting the reference voltage VREFM to a voltage lower than a withstand voltage of a low withstand voltage process, the operational amplifier may be implemented by a circuit element of the low withstand voltage process.

Further, since the sink current IK in the above equation (11) is variably controlled according to the power supply voltage VDD, the sink current IK in the above equation (11) is controlled such that the voltages VIP and VIN of the input nodes of the operational amplifier OPA are substantially the same as the reference voltage VREFM even when the power supply voltage VDD fluctuates. This makes it possible to use various power supplies having different power supply voltages, and the voltages VIP and VIN of the input nodes of the operational amplifier OPA are kept constant with respect to the various power supply voltages. When a battery is used as the power supply, the power supply voltage decreases as a battery remaining amount decreases, and the voltages VIP and VIN of the input nodes of the operational amplifier OPA are kept constant even when the power supply voltage decreases.

3. First Embodiment

Hereinafter, a method of correcting a detection error of a current value according to a first embodiment will be described. Illustration and description of the same components as those described above will be appropriately omitted.

Figure 4:
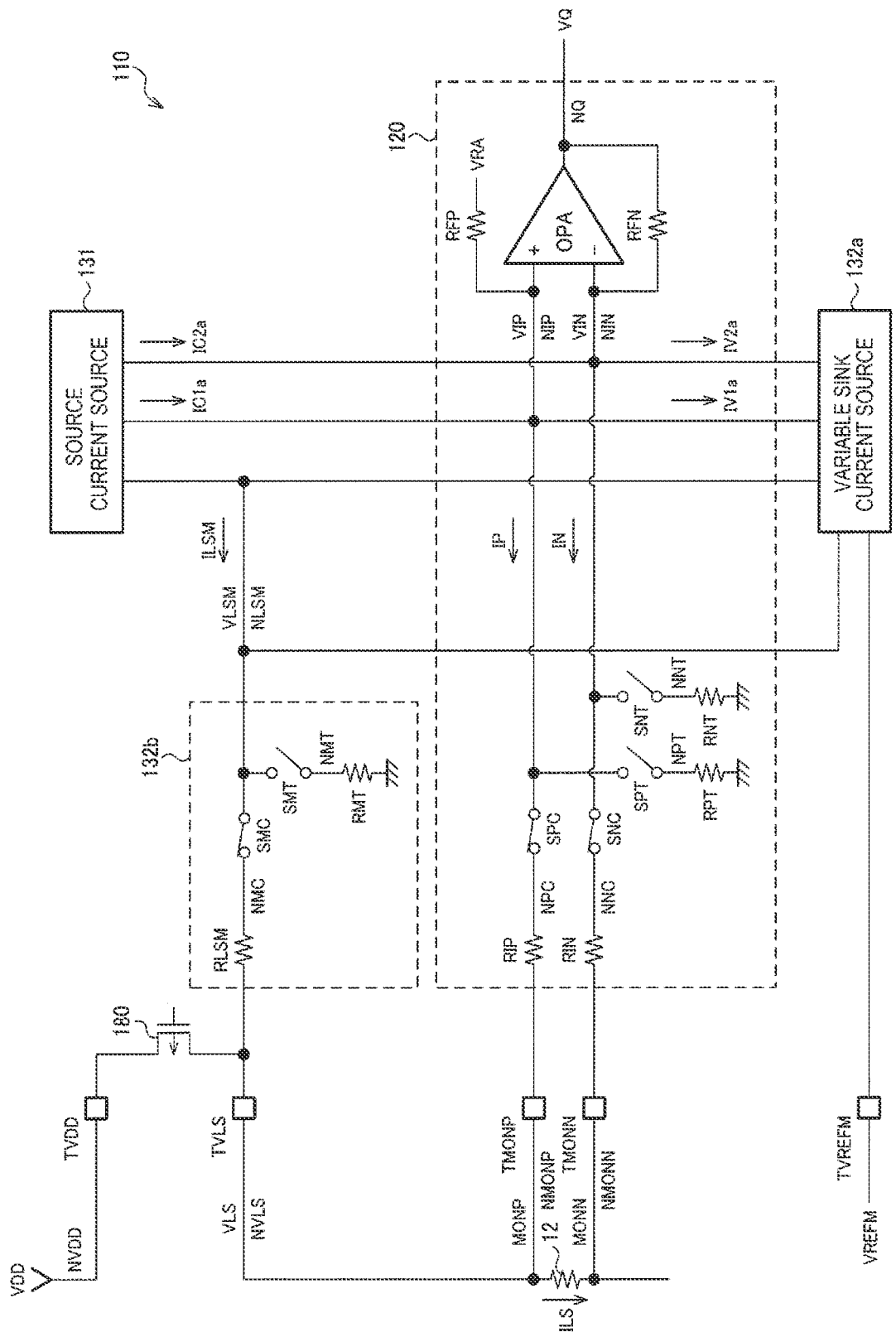
FIG. 4 shows a detailed configuration example of a current detection circuit according to a first embodiment.

FIG. 4 shows a detailed configuration example of the current detection circuit 110 according to the first embodiment. In this configuration example, the current sense amplifier circuit 120 includes a first switch SPC, a second switch SNC, a third resistor RPT, a fourth resistor RNT, a third switch SPT, and a fourth switch SNT. The resistor RLSM of the variable sink current source 132a is referred to as a fifth resistor. The variable sink current source 132a includes a fifth switch SMC, a sixth resistor RMT, and a sixth switch SMT.

The first switch SPC is provided in series with the first resistor RIP between the terminal TMONP and the first input node NIP. Specifically, one end of the first resistor RIP is coupled to the terminal TMONP, and the other end thereof is coupled to a first node NPC. One end of the first switch SPC is coupled to the first node NPC, and the other end thereof is coupled to the first input node NIP. The second switch SNC is provided in series with the second resistor RIN between the terminal TMONN and the second input node NIN. Specifically, one end of the second resistor RIN is coupled to the terminal TMONN, and the other end thereof is coupled to a second node NNC. One end of the second switch SNC is coupled to the second node NNC, and the other end thereof is coupled to the second input node NIN.

The third switch SPT is provided in series with the third resistor RPT between a ground node and the first input node NIP. Specifically, one end of the third resistor RPT is coupled to the ground node, and the other end thereof is coupled to a third node NPT. One end of the third switch SPT is coupled to the third node NPT, and the other end thereof is coupled to the first input node NIP. The fourth switch SNT is provided in series with the fourth resistor RNT between a ground node and the second input node NIN. Specifically, one end of the fourth resistor RNT is coupled to the ground node, and the other end thereof is coupled to a fourth node NNT. One end of the fourth switch SNT is coupled to the fourth node NNT, and the other end thereof is coupled to the second input node NIN.

The fifth switch SMC is provided in series with the fifth resistor RLSM between the terminal TVLS and the node NLSM. Specifically, one end of the fifth resistor RLSM is coupled to the terminal TVLS, and the other end thereof is coupled to a fifth node NMC. One end of the fifth switch SMC is coupled to the fifth node NMC, and the other end thereof is coupled to the node NLSM. The sixth switch SMT is provided in series with the sixth resistor RMT between a ground node and the node NLSM. Specifically, one end of the sixth resistor RMT is coupled to the ground node, and the other end thereof is coupled to a sixth node NMT. One end of the sixth switch SMT is coupled to the sixth node NMT, and the other end thereof is coupled to the node NLSM.

Resistance values of the first resistor RIP, the second resistor RIN, the third resistor RPT, the fourth resistor RNT, the fifth resistor RLSM, and the sixth resistor RMT are the same. Although FIG. 4 shows an example in which one ends of the third resistor RPT, the fourth resistor RNT, and the sixth resistor RMT are coupled to the ground nodes, the one ends of the third resistor RPT, the fourth resistor RNT, and the sixth resistor RMT may be coupled to constant voltage nodes having a constant potential.

The first switch SPC, the second switch SNC, the third switch SPT, the fourth switch SNT, the fifth switch SMC, and the sixth switch SMT are each, for example, an N-type transistor, a P-type transistor, or a transfer gate in which an N-type transistor and a P-type transistor are coupled in parallel.

FIG. 4 shows a switch state in a current detection period. In the current detection period, the control circuit 150 turns on the first switch SPC, the second switch SNC, and the fifth switch SMC, and turns off the third switch SPT, the fourth switch SNT, and the sixth switch SMT. As described in the above equations (1) and (2), the current sense amplifier circuit 120 detects the current ILS flowing through the shunt resistor 12, and outputs the detected voltage VQ as a result. The detected voltage VQ acquired in the current detection period is referred to as VCS, and a current value VCS/Rsh detected from the detected voltage VCS is referred to as a detected current value.

The above equations (1) and (2) show the ideal detected voltage VQ, but the detected voltage VCS actually includes an offset voltage Δvof as shown in the following equation (15). That is, a detected current value ICS includes a detection error corresponding to the offset voltage Δvof. In the first embodiment, the offset voltage Δvof includes, for example, an offset of the operational amplifier OPA, an offset of the analog ground voltage VRA, or both of them. Here, it is assumed that the following equations (15-2) and (15-3) are satisfied.

$$VCS = (RFN/RIN) \times Rsh \times ILS + VRA + \Delta vof \quad (15)$$

$$RIP = RIN, RFP = RFN \quad (15\text{-}2)$$

$$IC1a = IC2a, IV1a = IV2a \quad (15\text{-}3)$$

Figure 5:
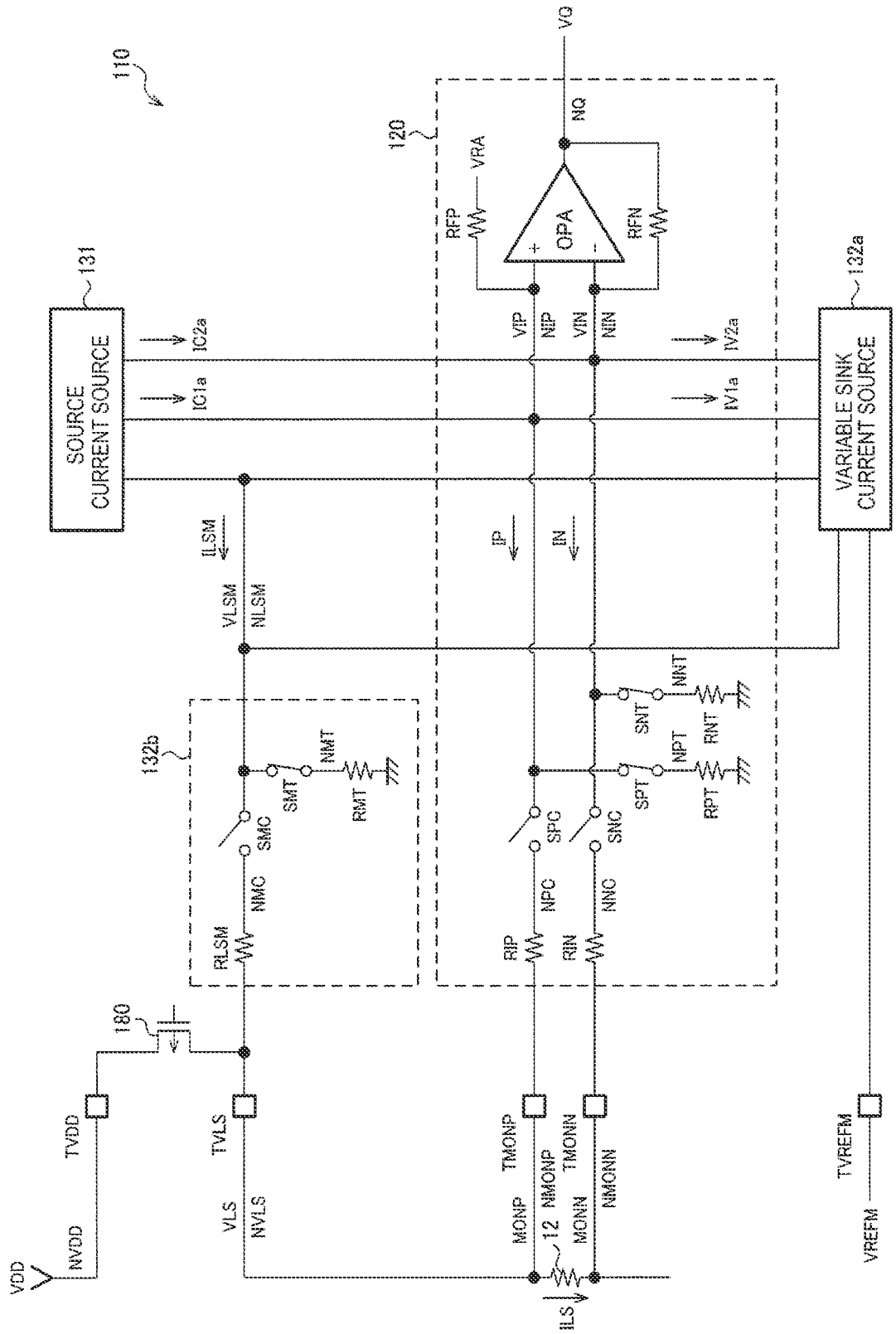
FIG. 5 shows a switch state in an offset detection period.

FIG. 5 shows a switch state in an offset detection period. In the offset detection period, the control circuit 150 turns off the first switch SPC, the second switch SNC, and the fifth switch SMC, and turns on the third switch SPT, the fourth switch SNT, and the sixth switch SMT. The detected voltage VQ acquired in the offset detection period is referred to as VOST. The detected voltage VOST corresponds to an offset value included in the detected current value ICS, and the offset value is referred to as IOST.

The state in FIG. 5 is equivalent to a state where both ends of the shunt resistor 12 are short-circuited to MONP=MONN=0 V in the voltage detection period. That is, from the above equations (1) and (15), the detected voltage VOST is given by the following equation (16).

$$VOST = VRA + \Delta vof \quad (16)$$

The control circuit 150 subtracts A/D conversion data of the detected voltage VOST from A/D conversion data of the detected voltage VCS to obtain data of a detected voltage VQcul with offset canceled, as shown in the following equation (17). Assuming that a current value detected from the voltage VQcul is referred to as a corrected current value ILScul, a relationship between VQcul and ILScul is given by the following equation (18). From the following equations

(17) and (18), obtaining the voltage VQcul based on the following equation (17) corresponds to obtaining the corrected current value ILScul based on the following equation (19). The control circuit 150 performs, based on the data of the detected voltage VQcul, the PWM control of the switching element 180, thereby performing PWM control based on the accurate corrected current value ILScul with offset canceled.

$$VQcul = VCS - VOST \quad (17)$$

$$VQcul = (RFN/RIN) \times Rsh \times ILScul \quad (18)$$

$$ILScul = ICS - IOST \quad (19)$$

Figure 6:
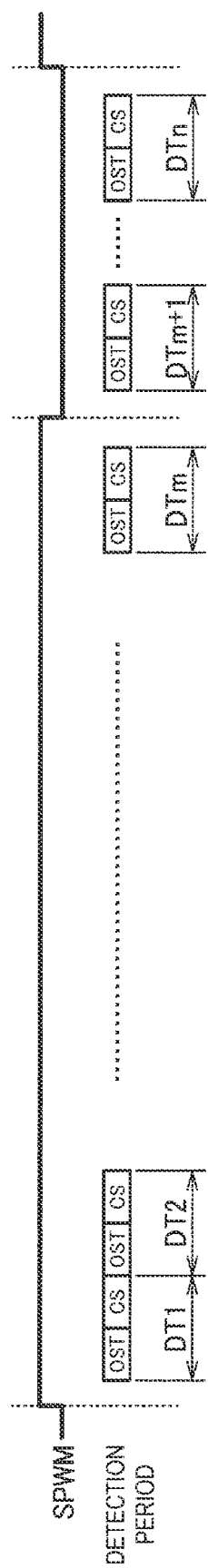
FIG. 6 is a timing chart showing a current detection operation according to the first embodiment.

FIG. 6 is a timing chart showing a current detection operation according to the first embodiment. Although the current detection operation in one cycle of the PWM signal SPWM is shown here, the same current detection operation is performed in each cycle. It is assumed that the switching element 180 is turned on when the PWM signal SPWM is at a high level, and the switching element 180 is turned off when the PWM signal SPWM is at a low level.

The control circuit 150 changes the PWM signal SPWM from the low level to the high level, performs operations in detection periods from a first detection period DT1 to an m-th detection period DTm after a wait period elapses, and changes the PWM signal SPWM from the high level to the low level after the wait period elapses. The control circuit 150 performs operations in detection periods from an (m+1)-th detection period DTm+1 to an n-th detection period DTn after the wait period elapses, and changes the PWM signal SPWM from the low level to the high level after the wait period elapses. n is an integer of 2 or more, and m is an integer of 1 or more and less than n. A high level period of the PWM signal SPWM is determined based on a current detection result in a period before this period. The control circuit 150 determines a value of m based on the high level period.

The first detection period DT1 includes an offset detection period indicated by "OST" and a current detection period indicated by "CS". FIG. 6 shows an example in which the offset detection period is before the current detection period, but the order may be reversed. The current sense amplifier circuit 120 detects a detected voltage VOST1 indicating an offset value in the offset detection period, and detects a detected voltage VCS1 indicating a detected current value in the current detection period. Similarly, the current sense amplifier circuit 120 detects, from a second detection period DT2 to the n-th detection period DTn, detected voltages VOST2 to VOSTn in offset detection periods, and detects detected voltages VCS2 to VCSn in current detection periods. The control circuit 150 obtains the voltage VQcul indicating the corrected current value ILScul based on the following equation (20).

$$VQcul = \frac{1}{n}\left\{\sum_{i=1}^{m}(VCSi - VOSTi) + \sum_{i=m+1}^{n}(VCSi - VOSTi)\right\} \quad (20)$$

In the embodiment described above, the circuit device 100 includes the current sense amplifier circuit 120 and the processing circuit 115. The switching element 180, the shunt resistor 12, and the inductor 11 are coupled in series between a first power supply node and a second power supply node. The current sense amplifier circuit 120 detects a current flowing through the shunt resistor 12. The processing circuit 115 obtains, based on an output of the current sense amplifier circuit 120, the corrected current value ILScul of the current ILS flowing through the shunt resistor 12. The current sense amplifier circuit 120 includes the operational amplifier OPA, the first resistor RIP, the first switch SPC, the second resistor RIN, the second switch SNC, the third resistor RPT, the third switch SPT, the fourth resistor RNT, and the fourth switch SNT. The first resistor RIP is provided between the first resistor node NMONP at one end of the shunt resistor 12 and the first node NPC. The first switch SPC is provided between the first node NPC and the first input node NIP of the operational amplifier OPA. The second resistor RIN is provided between the second resistor node NMONN at the other end of the shunt resistor 12 and the second node NNC. The second switch SNC is provided between the second node NNC and the second input node NIN of the operational amplifier OPA. The third resistor RPT is provided between a constant voltage node and the third node NPT. The third switch SPT is provided between the third node NPT and the first input node NIP. The fourth resistor RNT is provided between the constant voltage node and the fourth node NNT. The fourth switch SNT is provided between the fourth node NNT and the second input node NIN. In the current detection period, the first switch SPC and the second switch SNC are turned on, the third switch SPT and the fourth switch SNT are turned off, and the processing circuit 115 acquires the detected current value ICS based on the output of the current sense amplifier circuit 120. In the offset detection period, the first switch SPC and the second switch SNC are turned off, the third switch SPT and the fourth switch SNT are turned on, and the processing circuit 115 acquires the offset value IOST based on the output of the current sense amplifier circuit 120. The processing circuit 115 obtains the corrected current value ILScul based on the detected current value ICS and the offset value IOST.

According to the embodiment, the one end of the third resistor RPT and the one end of the fourth resistor RNT are coupled to the constant voltage nodes, and in the offset detection period, the first switch SPC and the second switch SNC are turned off and the third switch SPT and the fourth switch SNT are turned on. Accordingly, the same state as a state where a differential input of the current sense amplifier circuit 120 is short-circuited is formed, and thus the offset of the detected voltage VQ can be measured.

The four switches described above are coupled to an input node side of the operational amplifier OPA with respect to the first resistor RIP and the second resistor RIN. Accordingly, a voltage applied to the input node of the operational amplifier OPA is applied to the four switches, and a voltage at one end or the other end of the shunt resistor 12 is not directly applied to the four switches. The voltage at the one end or the other end of the shunt resistor 12 may be near the power supply voltage VDD or a negative voltage, but these voltages are not applied to the switches. Therefore, it is not necessary to make the switches have a process or a configuration that withstands a high voltage or a negative voltage.

In the example of FIG. 1, the first power supply node is one of the power supply node NVDD and the ground node, and the second power supply node is the other one of the power supply node NVDD and the ground node. In the examples of FIGS. 4 and 5, the constant voltage node is a ground node. In the above equation (17), the voltage VQcul corresponding to the corrected current value ILScul is obtained, which is equivalent to obtaining the corrected current value ILScul, as described in the above equations (18) and (19).

In the embodiment, the circuit device 100 includes the level shift circuit 130. The level shift circuit 130 level-shifts the voltages of the first input node NIP and the second input node NIN by supplying the first current IP to the first input node NIP and supplying the second current IN to the second input node NIN.

As described in FIG. 3, the voltage VLS corresponding to a common mode voltage greatly fluctuates due to PWM driving. When the level shift circuit 130 is not provided, the input voltages VIP and VIN of the operational amplifier OPA also fluctuate as the common mode voltage fluctuates. According to the embodiment, the level shift circuit 130 level-shifts the voltages of the first input node NIP and the second input node NIN, thereby reducing fluctuations in the input voltages VIP and VIN of the operational amplifier OPA.

In the embodiment, the level shift circuit 130 level-shifts the voltages of the first input node NIP and the second input node NIN by a variable level shift amount according to the voltage VLS of the first resistor node NMONP by variably controlling the first current IP and the second current IN according to the voltage VLS of the first resistor node NMONP.

According to the embodiment, the input voltages VIP and VIN of the operational amplifier OPA can be level-shifted by the level shift amount according to the common mode voltage by performing level-shifting by the variable level shift amount according to the voltage VLS of the first resistor node NMONP. Accordingly, the input voltages VIP and VIN of the operational amplifier OPA are controlled according to the common mode voltage, and thus the fluctuation thereof is reduced.

In the embodiment, the level shift amount is a difference between the reference voltage VREFM and the voltage VLS of the first resistor node NMONP.

According to the embodiment, the input voltages VIP and VIN of the operational amplifier OPA can be level-shifted to a voltage substantially equal to the reference voltage VREFM. Accordingly, even when the common mode voltage fluctuates, the input voltages VIP and VIN of the operational amplifier OPA can be maintained at the voltage substantially equal to the reference voltage VREFM. Since the voltages applied to the first to fourth switches are the voltage substantially equal to the reference voltage VREFM, the first to fourth switches may have a process or a configuration that withstands the voltage substantially equal to the reference voltage VREFM.

In the embodiment, the circuit device 100 includes the drive circuit 160 that drives the switching element 180 by the PWM signal SPWM based on the corrected current value ILScul. The processing circuit 115 acquires, in detection periods from the first detection period DT1 to the n-th detection period DTn in the one cycle of the PWM signal SPWM, the detected current value ICS in the current detection period and the offset value IOST in the offset detection period.

As described in FIG. 3, the current ILS flowing through the shunt resistor 12 fluctuates due to the PWM driving. According to the embodiment, an average current value can be obtained by performing the current detection a plurality of times in the one cycle of the PWM signal SPWM.

In the embodiment, the processing circuit 115 obtains, as the corrected current value ILScul in the one cycle, an average value of differences between the detected current values ICS and the offset values IOST acquired in the detection periods from the first detection period DT1 to the n-th detection period DTn.

According to the embodiment, current values after offset cancellation in the detection periods are obtained based on the differences between the detected current values ICS and the offset values IOST, and the corrected current value ILScul in the one cycle is obtained based on the average value of the current values.

In the above equation (20), the voltage VQcul corresponding to the corrected current value ILScul is obtained, which is equivalent to obtaining the corrected current value ILScul.

In the embodiment, detection periods from the first detection period DT1 to the n-th detection period DTn include detection periods from the first detection period DT1 to the m-th detection period DTm in a first voltage level period of the PWM signal SPWM and detection periods from the (m+1)-th detection period DTm+1 to the n-th detection period DTn in a second voltage level period of the PWM signal SPWM. The processing circuit 115 obtains, as a corrected current value in the first voltage level period, an average value of differences between the detected current values ICS and the offset values IOST acquired in the detection periods from the first detection period DT1 to the m-th detection period DTm. The processing circuit 115 obtains, as a corrected current value in the second voltage level period, an average value of differences between the detected current values ICS and the offset values IOST acquired in the detection periods from the (m+1)-th detection period DTm+1 to the n-th detection period DTn. The processing circuit 115 obtains the corrected current value ILScul based on the corrected current value in the first voltage level period and the corrected current value in the second voltage level period.

As described in FIG. 3, the current ILS flowing through the shunt resistor 12 increases during an ON period of the switching element 180 and decreases during an OFF period of the switching element 180. According to the embodiment, since the detection period is set for both the ON period and the OFF period of the switching element 180, the corrected current value ILScul in the one cycle can be accurately obtained.

In the example of FIG. 6, the first voltage level period is a high level period of the PWM signal or the ON period of the switching element 180, and the second voltage level period is a low level period of the PWM signal or the OFF period of the switching element 180. In the above equation (20), a first sum on the right side corresponds to the average value from the first detection period DT1 to the m-th detection period DTm, and a second sum on the right side corresponds to the average value from the (m+1)-th detection period DTm+1 to the n-th detection period DTn.

In the embodiment, the switching element 180 is coupled between the first power supply node and the first resistor node NMONP. The diode DA is coupled between the first resistor node NMONP and the second power supply node which is a ground node. The inductor 11 is coupled between the second resistor node NMONN and the ground node. The current sense amplifier circuit 120 detects the detected current value ICS by detecting a voltage difference between the first resistor node NMONP and the second resistor node NMONN.

The common mode voltage is near the power supply voltage of the first power supply node in the ON period of the switching element 180, and the common mode voltage is a negative voltage in the OFF period of the switching element 180. The negative voltage is a voltage lower than the ground voltage by a forward voltage of the diode DA. According to the embodiment, as described above, these voltages are not directly input to the first to fourth switches.

4. Second Embodiment

A method of correcting a detection error of a current value according to a second embodiment will be described. Illustration and description of the same components as those described above will be appropriately omitted.

In the second embodiment, as in the first embodiment, an offset of the operational amplifier OPA or the like can be cancelled, and a current detection error caused by a mismatch of a resistance or a current can be cancelled. First, the current detection error caused by a mismatch of a resistor or a current will be described with reference to FIGS. 7 to 10.

Figure 7:
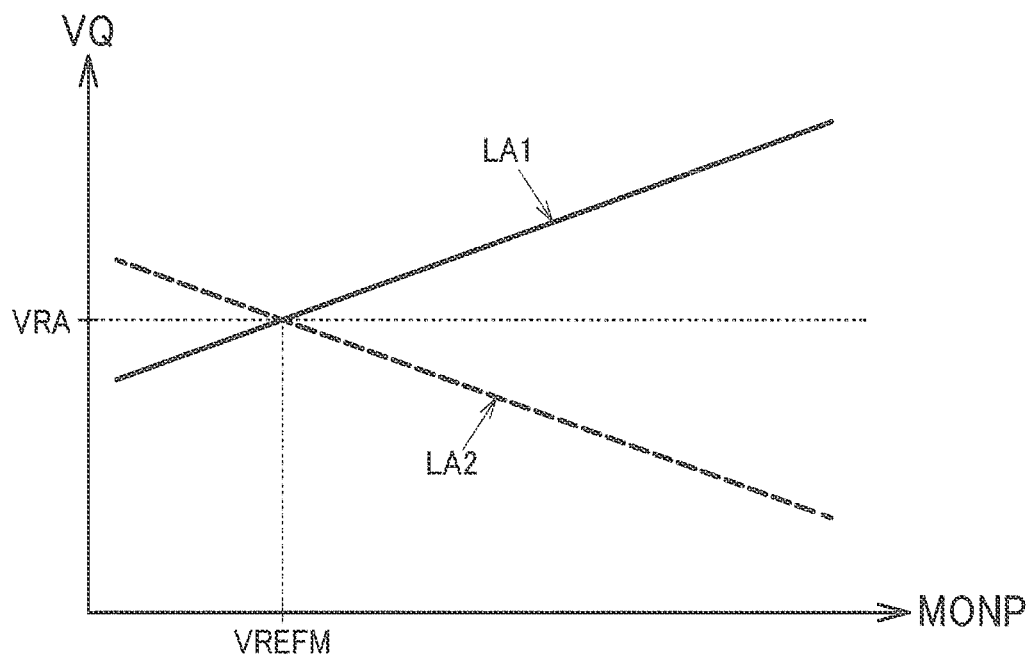
FIG. 7 shows a first error component depending on a common mode voltage in a current detection period.

FIG. 7 shows a first error component depending on a common mode voltage in the current detection period of FIG. 4. FIG. 7 shows the first error component of the detected voltage VQ when both ends of the shunt resistor 12 are short-circuited and the voltage MONP at one end of the shunt resistor 12 is changed. Here, it is assumed that IP=IN.

The first error component is caused by a mismatch between a resistance value of the first resistor RIP and a resistance value of the second resistor RIN. When RIP=RIN where there is no mismatch, the detected voltage VQ is the analog ground voltage VRA, which is an expected value. As indicated by LA1, when RIP<RIN, the detected voltage VQ has a positive linear characteristic with respect to the voltage MONP. As indicated by LA2, when RIP>RIN, the detected voltage VQ has a negative linear characteristic with respect to the voltage MONP.

Since VIP=VIN=VREFM, IP=IN=0 when MONP=VREFM. Therefore, RIP×IP=RIN×IN=0, the influence of the resistance mismatch does not occur, and thus VQ=VRA. When MONP≠VREFM, IP=IN≠0, and therefore, RIP×IP≠RIN×IN. This is equivalent to the fact that a potential difference occurs between the both ends of the shunt resistor 12, and thus an error occurs with respect to VQ=VRA, which is an expected value. Since the first current IP and the second current IN depend on the voltage MONP, the first error component of the detected voltage VQ depends on the voltage MONP.

Figure 8:
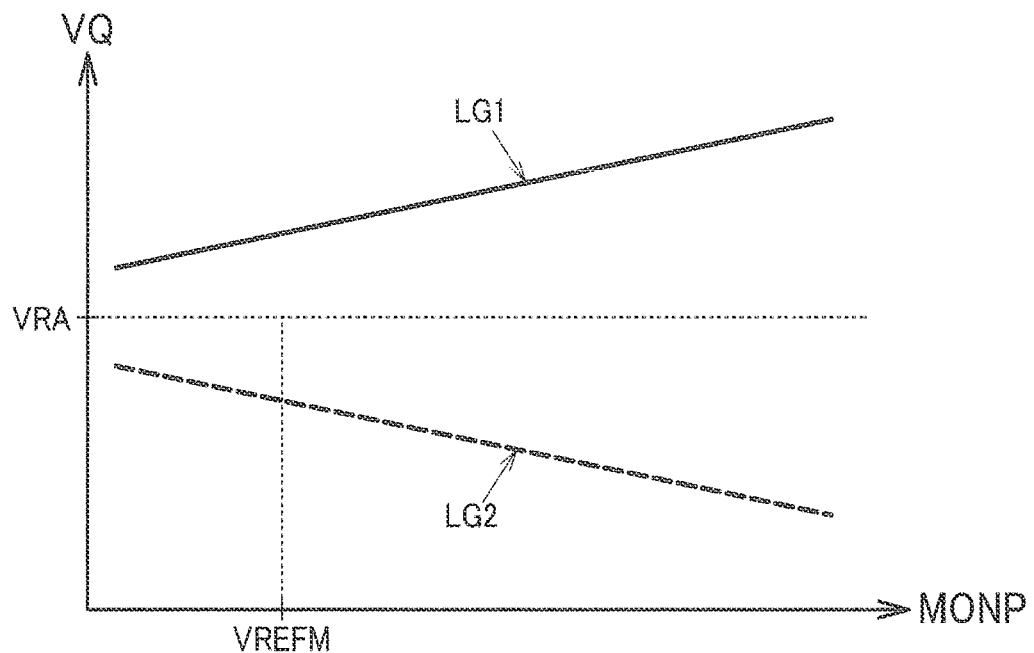
FIG. 8 shows a second error component depending on the common mode voltage in the current detection period.

FIG. 8 shows a second error component depending on the common mode voltage in the current detection period of FIG. 4. FIG. 8 shows the second error component of the detected voltage VQ when the both ends of the shunt resistor 12 are short-circuited and the voltage MONP at one end of the shunt resistor 12 is changed. Here, it is assumed that RIP=RIN and IC1a=IC2a.

The second error component is caused by a mismatch between a current value of the variable current IV1a and a current value of the variable current IV2a. When IV1a=IV2a where there is no mismatch, the detected voltage VQ is the analog ground voltage VRA, which is an expected value. As indicated by LG1, when IV1a<IV2a, the detected voltage VQ has a positive linear characteristic with respect to the voltage MONP. As indicated by LG2, when IV1a>IV2a, the detected voltage VQ has a negative linear characteristic with respect to the voltage MONP.

When IV1a≠IV2a, IP≠IN, and therefore, RIP×IP≠RIN× IN. Therefore, an error occurs with respect to VQ=VRA, which is an expected value. Since the variable current IV1a and the variable current IV2a depend on the voltage MONP, the second error component of the detected voltage VQ depends on the voltage MONP. Since IV1a≠IV2a even when MONP=VREFM, VQ=VRA is not satisfied even when MONP=VREFM.

Figure 9:
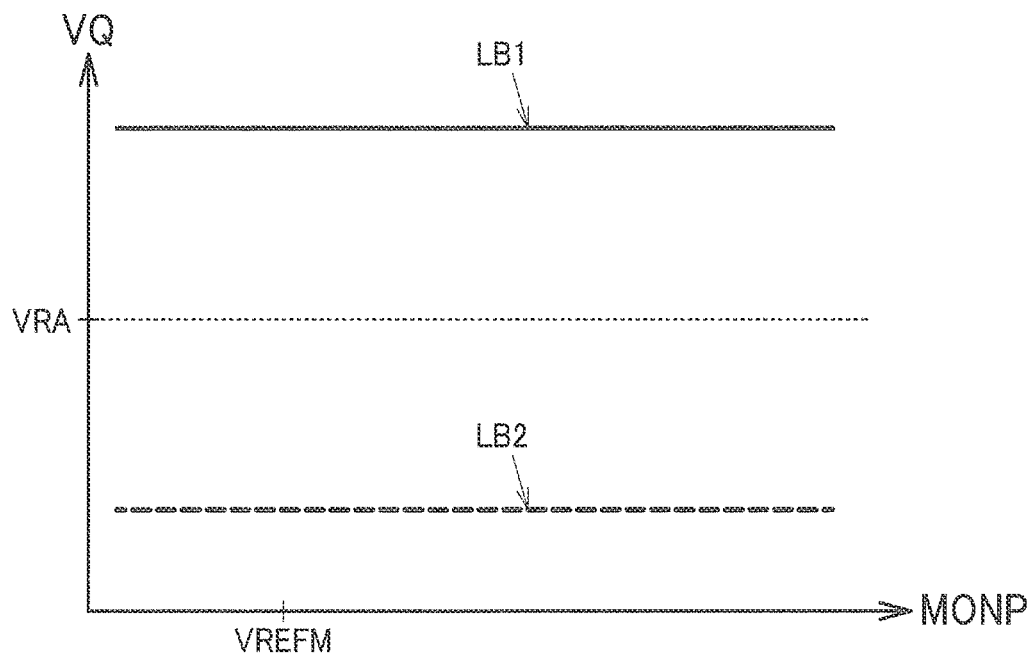
FIG. 9 shows a third error component independent of the common mode voltage in the current detection period.

FIG. 9 shows a third error component independent of the common mode voltage in the current detection period of FIG. 4. FIG. 9 shows the third error component of the detected voltage VQ when the both ends of the shunt resistor 12 are short-circuited and the voltage MONP at one end of the shunt resistor 12 is changed. Here, it is assumed that RIP=RIN and IV1a=IV2a.

The third error component is caused by a mismatch between a current value of the constant current IC1a and a current value of the constant current IC2a. When IC1a=IC2a where there is no mismatch, the detected voltage VQ is the analog ground voltage VRA, which is an expected value. As indicated by LB1, when IC1a>IC2a, the detected voltage VQ is a constant value independent of the voltage MONP, and VQ>VRA. As indicated by LB2, when IC1a<IC2a, the detected voltage VQ is a constant value independent of the voltage MONP, and VQ<VRA.

When IC1a≠IC2a, IP≠IN, and therefore, RIP×IP≠RIN× IN. Therefore, an error occurs with respect to VQ=VRA, which is an expected value. Since the constant current IC1a and the constant current IC2a are independent of the voltage MONP, the third error component of the detected voltage VQ is independent of the voltage MONP.

In the current detection period, the current detection error caused by the mismatch of the resistance or the current is an error obtained by summing the first to third error components.

Figure 10:
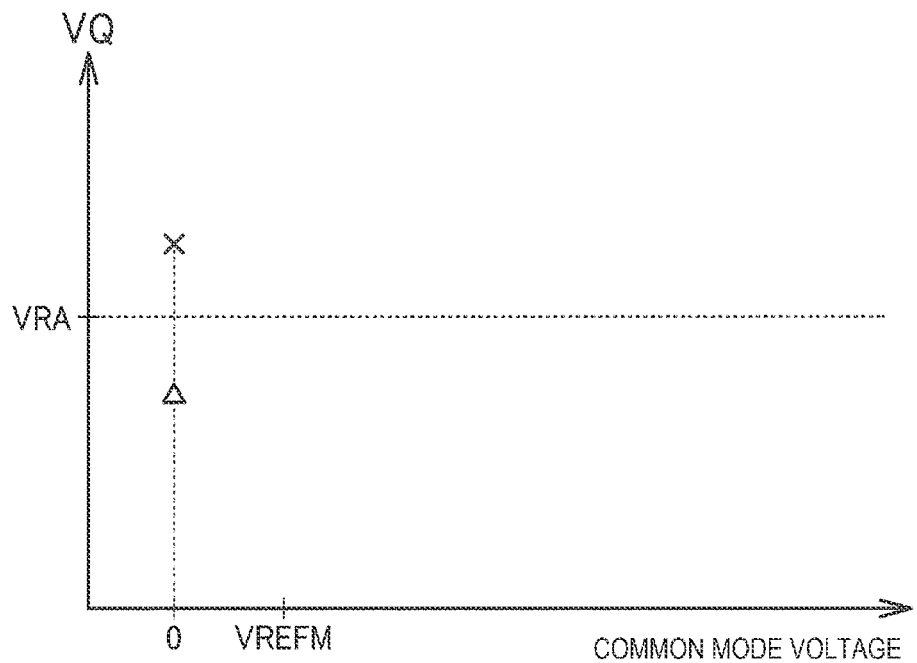
FIG. 10 shows an error component in the offset detection period.

FIG. 10 shows an error component in the offset detection period of FIG. 5. Since one end of the third resistor RPT and one end of the fourth resistor RNT are coupled to the ground node, a detection error when the common mode voltage is 0 V is output.

The error component is caused by at least one of a mismatch between a resistance value of the third resistor RPT and a resistance value of the fourth resistor RNT, the mismatch between the current value of the variable current IV1a and the current value of the variable current IV2a, and the mismatch between the current value of the constant current IC1a and the current value of the constant current IC2a. When there is no mismatch, the detected voltage VQ is the analog ground voltage VRA, which is an expected value. As indicated by LC1 or LC2, when there is a mismatch, an error occurs with respect to VQ=VRA, which is an expected value. Whether VQ>VRA or VQ<VRA is determined based on a sum of errors caused by the mismatches.

Figure 11:
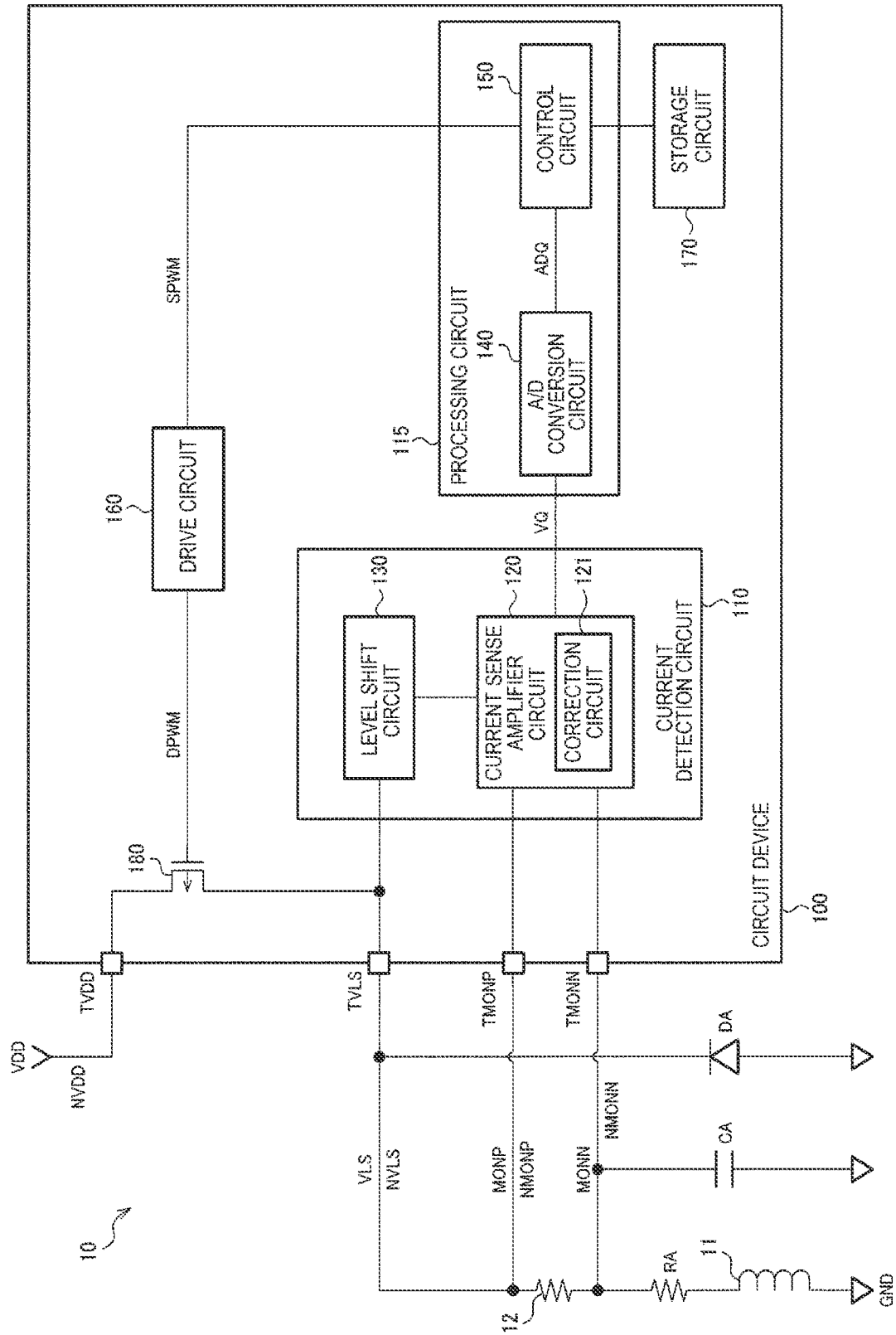
FIG. 11 shows a detailed configuration example of a circuit device according to a second embodiment.

FIG. 11 is a detailed configuration example of the circuit device 100 according to the second embodiment. In this configuration example, the current sense amplifier circuit 120 includes a correction circuit 121.

The correction circuit 121 corrects at least one of the mismatch between the resistance value of the first resistor RIP and the resistance value of the second resistor RIN and the mismatch between the first current IP and the second current IN. The storage circuit 170 stores correction information for correcting the at least one mismatch. The control circuit 150 sets the correction circuit 121 based on the correction information stored in the storage circuit 170. The correction circuit 121 is led to a state where the at least one mismatch can be corrected. The setting is executed, for example, during initialization at the time of power-on.

The correction information is acquired, for example, during inspection at the time of manufacturing. The correction information is written into the storage circuit 170 from an external processing device or the like, for example, during the initialization at the time of power-on. Alternatively, the storage circuit 170 is a nonvolatile memory, and the correction information is stored in the nonvolatile memory at the time of manufacturing.

Figure 12:
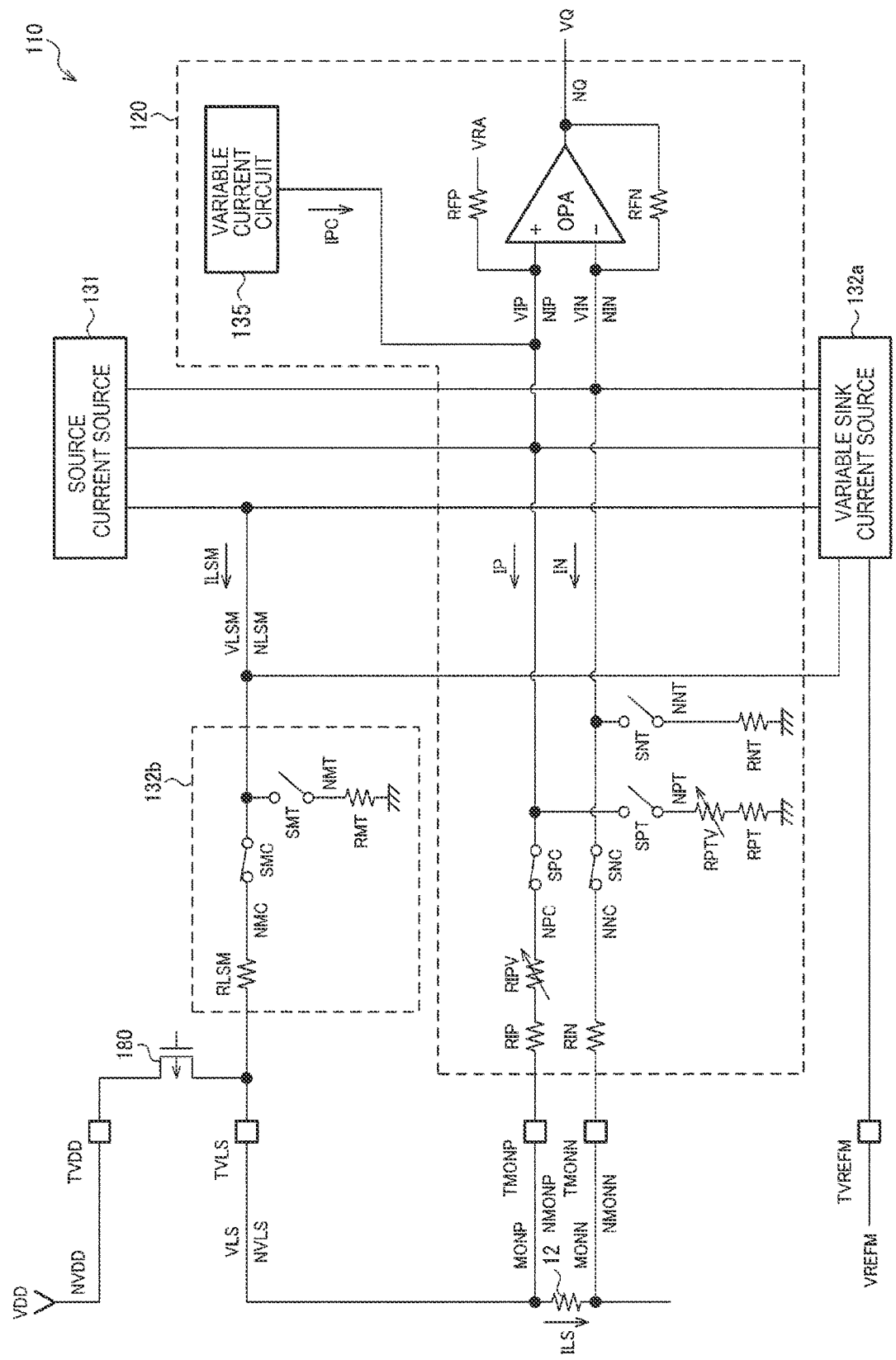
FIG. 12 shows a first detailed configuration example of a current detection circuit according to the second embodiment.

FIG. 12 is a first detailed configuration example of the current detection circuit 110 according to the second embodiment. In this configuration example, the current sense amplifier circuit 120 includes, as the correction circuit 121, a first variable resistor RIPV, a second variable resistor RPTV, and a variable current circuit 135.

The first variable resistor RIPV is provided in series with the first resistor RIP between the terminal TMONP and the first node NPC. Specifically, one end of the first variable resistor RIPV is coupled to the other end of the first resistor RIP, and the other end of the first variable resistor RIPV is coupled to the first node NPC. The first variable resistor RIPV includes, for example, a plurality of resistors and a plurality of switches for switching coupling between the resistors.

The second variable resistor RPTV is provided in series with the third resistor RPT between the ground node and the third node NPT. Specifically, one end of the second variable resistor RPTV is coupled to the other end of the third resistor RPT, and the other end of the second variable resistor RPTV is coupled to the third node NPT. The second variable resistor RPTV includes, for example, a plurality of resistors and a plurality of switches for switching coupling between the resistors.

An output node of the variable current circuit 135 is coupled to the first input node NIP of the operational amplifier OPA. The variable current circuit 135 supplies a corrected current IPC, which is a source current or a sink current, to the first input node NIP. FIG. 12 shows an example in which the corrected current IPC is a source current. The output node of the variable current circuit 135 may be coupled to the second input node NIN instead of the first input node NIP.

The correction information includes a resistance set value of the first variable resistor RIPV, a resistance set value of the second variable resistor RPTV, and a current set value of the corrected current IPC. The control circuit 150 sets, based on the correction information, the resistance set value of the first variable resistor RIPV, the resistance set value of the second variable resistor RPTV, and the current set value of the corrected current IPC.

Operations in the current detection period and the offset detection period and a process of obtaining the corrected current value from the detected current value and the offset value are the same as those in the first embodiment.

Figure 13:
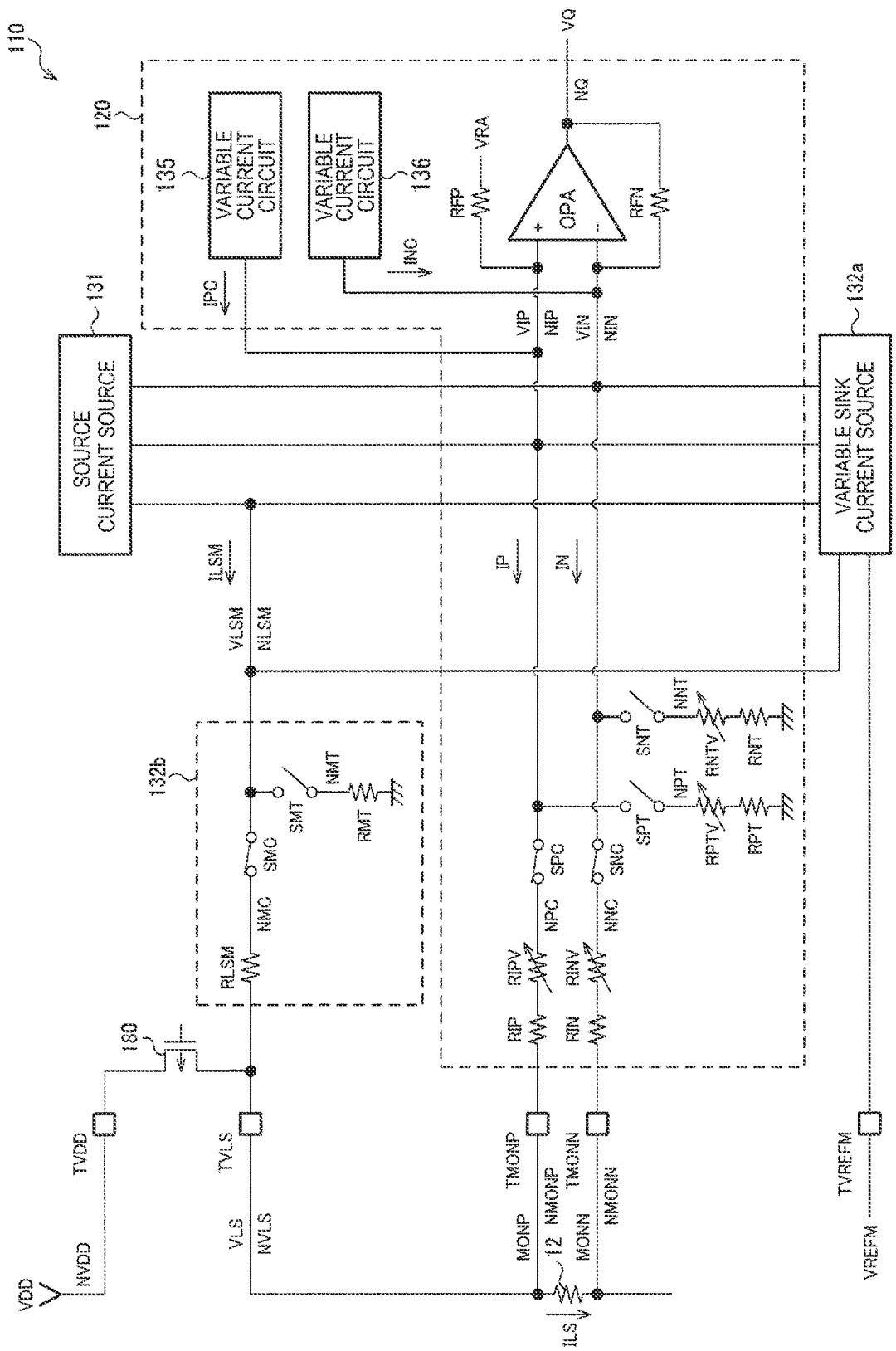
FIG. 13 shows a second detailed configuration example of the current detection circuit according to the second embodiment.

FIG. 13 is a second detailed configuration example of the current detection circuit 110 according to the second embodiment. In this configuration example, the current sense amplifier circuit 120 includes, as the correction circuit 121, the first variable resistor RIPV, the second variable resistor RPTV, a third variable resistor RINV, a fourth variable resistor RNTV, the variable current circuit 135, and a variable current circuit 136.

The second variable resistor RPTV is provided in series with the second resistor RIN between the terminal TMONN and the second node NNC. The fourth variable resistor RNTV is provided in series with the fourth resistor RNT between the ground node and the fourth node NNT. The corrected current IPC is referred to as a first corrected current. The variable current circuit 136 supplies a second corrected current INC, which is a source current or a sink current, to the second input node NIN.

Figure 14:
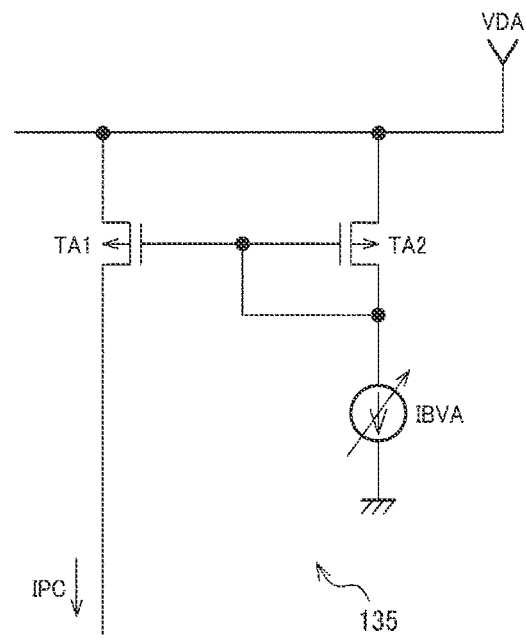
FIG. 14 shows a first detailed configuration example of a variable current circuit.

FIG. 14 is a first detailed configuration example of the variable current circuit 135. The variable current circuit 135 includes P-type transistors TA1 and TA2 constituting a current mirror circuit, and a variable current source IBVA. The current mirror circuit mirrors an output current of the variable current source IBVA to output the corrected current IPC, which is a source current.

Figure 15:
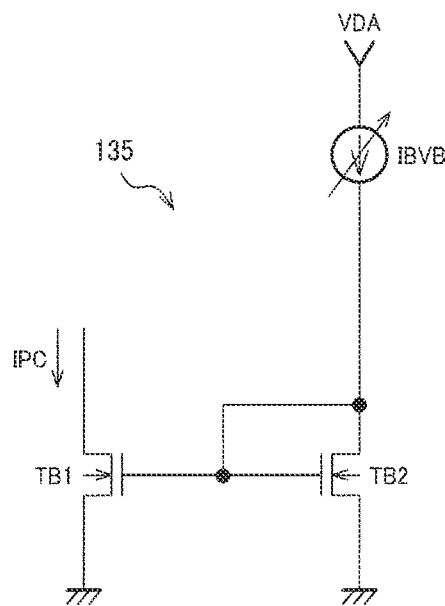
FIG. 15 shows a second detailed configuration example of the variable current circuit.

FIG. 15 shows a second detailed configuration example of the variable current circuit 135. The variable current circuit 135 includes N-type transistors TB1 and TB2 constituting the current mirror circuit, and a variable current source IBVB. The current mirror circuit mirrors an output current of the variable current source IBVB to output the corrected current IPC, which is a sink current.

The control circuit 150 controls a current value of the corrected current IPC by controlling an output current value of the variable current source IBVA or IBVB.

The variable current circuit 135 includes both the configuration of FIG. 14 and the configuration of FIG. 15, and may selectively output the source current or the sink current. The variable current circuit 135 is described above as an example, and the configuration of the variable current circuit 136 is the same as the configuration of the variable current circuit 135.

Figure 16:
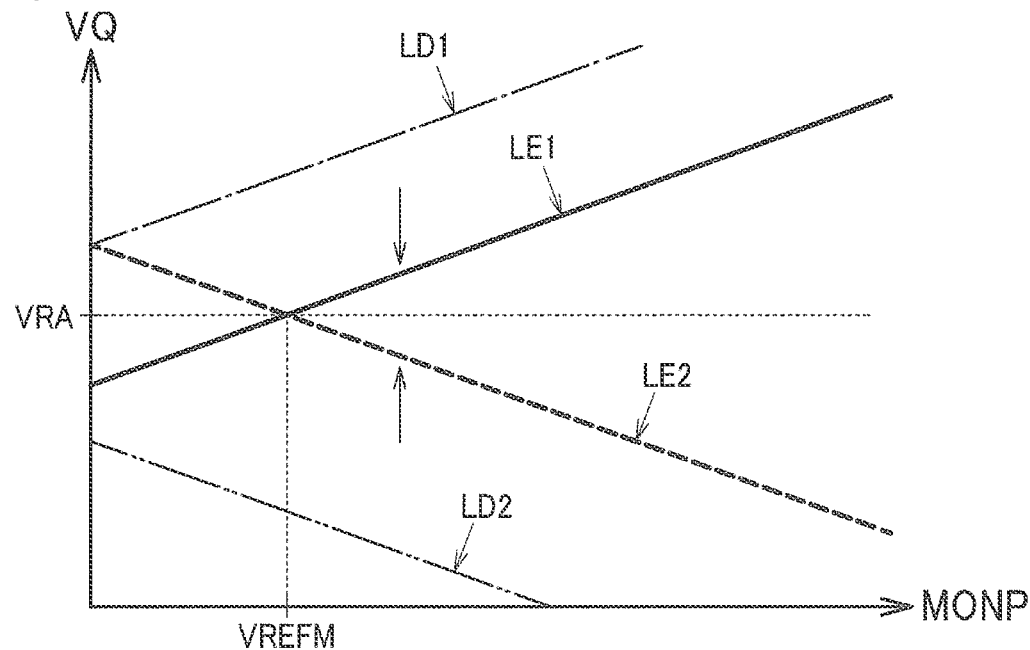
FIG. 16 shows a procedure for determining correction information.
Figure 16:
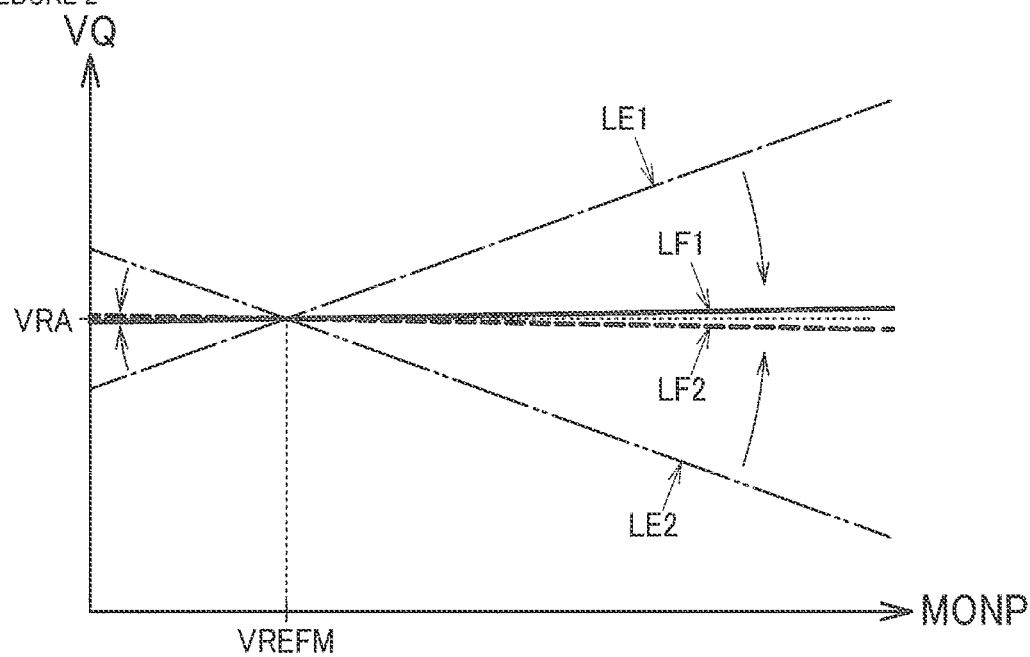

FIG. 16 is a diagram showing a procedure for determining the correction information. This procedure is executed, for example, during the inspection at the time of manufacturing. Hereinafter, an example in which an inspection apparatus executes these procedures will be described.

In a procedure 1, the inspection apparatus sets a switch state in the current detection period, short-circuits the both ends of the shunt resistor 12, and sets MONP=VREFM. The inspection apparatus monitors the detection data ADQ while changing the current set value of the corrected current IPC, and determines the current set value at which VQ=VRA. When the corrected current IPC is changed, a slope of the detected voltage VQ with respect to the voltage MONP does not change, but an intercept thereof changes, and therefore, in the procedure 1, the detected voltage VQ at MONP=VREFM is corrected to an expected value. Hereinafter, it is assumed that the corrected current IPC is a source current. As indicated by LD1, when VQ>VRA at MONP=VREFM, the inspection apparatus decreases the corrected current IPC, thereby lowering the detected voltage VQ as indicated by LE1. As indicated by LD2, when VQ<VRA at MONP=VREFM, the inspection apparatus increases the corrected current IPC, thereby increasing the detected voltage VQ as indicated by LE2.

In a procedure 2, the inspection apparatus sets a switch state in the current detection period, short-circuits the both ends of the shunt resistor 12, and sets MONP 0 VREFM. The inspection apparatus monitors the detection data ADQ while changing the resistance set value of the first variable resistor RIPV, and determines the resistance set value at which VQ=VRA. When the resistance value of the first variable resistor RIPV is changed, a slope of the detected voltage VQ with respect to the voltage MONP changes while maintaining VQ=VRA at MONP=VREFM. Therefore, in the procedure 2, the detected voltage VQ is corrected to an expected value without depending on the voltage MONP. As indicated by LE1, when the detected voltage VQ has a positive slope, the inspection apparatus increases the resistance set value of the first variable resistor RIPV, thereby making the slope of the detected voltage VQ approach zero as indicated by LF1. As indicated by LE2, when the detected voltage VQ has a negative slope, the inspection apparatus decreases the resistance set value of the first variable resistor RIPV, thereby making the slope of the detected voltage VQ approach zero as indicated by LF2.

In the procedure 2, the inspection apparatus sets a switch state in the offset detection period, monitors the detection data ADQ while changing the resistance set value of the second variable resistor RPTV, and determines the resistance set value at which VQ=VRA. Accordingly, the detected voltage VQ is corrected to an expected value in the offset detection. However, the detected voltage VOST indicating the offset value may fluctuate due to a power supply voltage, a temperature fluctuation, or the like. The fluctuation is detected in the offset detection period, and is cancelled based on the above equation (17).

In the embodiment described above, the circuit device 100 includes the current sense amplifier circuit 120, the level shift circuit 130, and the storage circuit 170. The switching element 180, the shunt resistor 12, and the inductor 11 are coupled in series between a first power supply node and a second power supply node. The current sense amplifier circuit 120 detects a current flowing through the shunt resistor 12. The current sense amplifier circuit 120 includes the operational amplifier OPA, the first resistor RIP, the second resistor RIN, and the correction circuit 121. The first resistor RIP is provided between the first resistor node NMONP at one end of the shunt resistor 12 and the first input node NIP of the operational amplifier OPA. The second resistor RIN is provided between the second resistor node NMONN at the other end of the shunt resistor 12 and the second input node NIN of the operational amplifier OPA. The level shift circuit 130 level-shifts the voltages of the first input node NIP and the second input node NIN by supplying the first current IP to the first input node NIP and supplying the second current IN to the second input node NIN. The storage circuit 170 stores the correction information for correcting at least one of the mismatch between the first resistor RIP and the second resistor RIN and the mismatch between the first current IP and the second current IN. The correction circuit 121 corrects a detection error of the current sense amplifier circuit 120 caused by the at least one mismatch by correcting the at least one mismatch based on the correction information.

When there is the mismatch between the first resistor RIP and the second resistor RIN or the mismatch between the first current IP and the second current IN, the mismatch causes the detection error of the current sense amplifier circuit 120. According to the embodiment, the at least one mismatch is corrected based on the correction information for correcting the at least one of the mismatch between the first resistor RIP and the second resistor RIN and the mismatch between the first current IP and the second current IN. Accordingly, the detection error of the current sense amplifier circuit 120 caused by the at least one mismatch is corrected. Accordingly, the current sense amplifier circuit 120 can accurately detect the current flowing through the shunt resistor 12.

In addition, as described in FIGS. 7 and 8, the detection error may depend on the common mode voltage. As described in FIG. 16, according to the embodiment, the detection error depending on the common mode voltage can be corrected.

The mismatch between the first resistor RIP and the second resistor RIN means that the resistance values of the first resistor RIP and the second resistor RIN are different from each other. The mismatch between the first current IP and the second current IN means that the current values of the first current IP and the second current IN are different from each other.

In the embodiment, the correction circuit 121 includes the first variable resistor RIPV. The first variable resistor RIPV is provided in series with the first resistor RIP between the first resistor node NMONP and the first input node NIP. The storage circuit 170 stores the resistance set value of the first variable resistor RIPV as the correction information.

As described in the procedure 2 of FIG. 16, the slope of the detected voltage VQ caused by the at least one mismatch can be corrected by adjusting the resistance value of the first variable resistor RIPV. According to the embodiment, the resistance set value of the first variable resistor RIPV for correcting the slope of the detected voltage VQ is stored in the storage circuit 170, and the resistance value of the first variable resistor RIPV is set based on the resistance set value, whereby the slope of the detected voltage VQ caused by the at least one mismatch is corrected.

In the embodiment, the first variable resistor RIPV is provided between the first resistor RIP and the first input node NIP.

According to the embodiment, the first variable resistor RIPV is coupled to the input node side of the operational amplifier OPA with respect to the first resistor RIP. Accordingly, a voltage near the power supply voltage VDD or a negative voltage, which is a voltage at one end or the other end of the shunt resistor 12, is not applied to the first variable resistor RIPV. Therefore, it is not necessary to make the switch or the like provided in the first variable resistor RIPV have a process or a configuration that withstands a high voltage or a negative voltage.

In the embodiment, the first input node NIP is a non-inverting input node of the operational amplifier OPA, and the second input node NIN is an inverting input node of the operational amplifier OPA. The current sense amplifier circuit 120 includes the feedback resistor RFN provided between the output node NQ and the inverting input node of the operational amplifier OPA.

According to the embodiment, a gain of the current sense amplifier circuit 120 is a ratio of the resistance value of the second resistor RIN to the resistance value of the feedback resistor RFN. By providing the first variable resistor RIPV on the first resistor RIP side, the detection error caused by the at least one mismatch can be reduced without changing the gain of the current sense amplifier circuit 120.

In the embodiment, the correction circuit 121 includes the variable current circuit 135 that supplies the corrected current IPC to the first input node NIP or the second input node NIN. The storage circuit 170 stores the current set value of the corrected current IPC as the correction information.

As described in the procedure 1 of FIG. 16, the intercept of the detected voltage VQ caused by the at least one mismatch can be corrected by adjusting the current value of the corrected current IPC. According to the embodiment, the current set value of the corrected current IPC for correcting the intercept of the detected voltage VQ is stored in the storage circuit 170, and the current value of the corrected current IPC is set based on the current set value, whereby the intercept of the detected voltage VQ caused by the at least one mismatch is corrected.

In the embodiment, the first resistor RIP and the first variable resistor RIPV are provided between the first resistor node NMONP and the first node NPC. The second resistor RIN is provided between the second resistor node NMONN and the second node NNC. The current sense amplifier circuit 120 includes the operational amplifier OPA, the first switch SPC, the second switch SNC, the third resistor RPT, the third switch SPT, the fourth resistor RNT, and the fourth switch SNT. The first switch SPC is provided between the first node NPC and the first input node NIP of the operational amplifier OPA. The second switch SNC is provided between the second node NNC and the second input node NIN of the operational amplifier OPA. The third resistor RPT is provided between a constant voltage node and the third node NPT. The third switch SPT is provided between the third node NPT and the first input node NIP. The fourth resistor RNT is provided between the constant voltage node and the fourth node NNT. The fourth switch SNT is provided between the fourth node NNT and the second input node NIN.

According to the embodiment, when the first switch SPC and the second switch SNC are turned on, the current flowing through the shunt resistor 12 can be detected. The current detection error is corrected by correcting the at least one of the mismatch between the first resistor RIP and the second resistor RIN and the mismatch between the first current IP and the second current IN.

In the embodiment, the correction circuit 121 includes the second variable resistor RPTV provided in series with the third resistor RPT between the constant voltage node and the third node NPT. The storage circuit 170 stores the resistance set value of the second variable resistor RPTV as the correction information.

According to the embodiment, when the third switch SPT and the fourth switch SNT are turned on, an offset of the current sense amplifier circuit 120 can be detected. As described in the procedure 2 of FIG. 16, the error of the detected voltage VQ in the offset detection can be corrected by adjusting the resistance value of the second variable resistor RPTV.

In the embodiment, the level shift circuit 130 includes a first constant current source, a second constant current source, a first variable current source, a second variable current source, and a current control circuit. The first constant current source supplies the first constant current IC1a, which is a source current, to the first input node NIP. The second constant current source supplies the second constant current IC2a, which is a source current, to the second input node NIN. The first variable current source supplies the first variable current IV1a, which is a sink current, to the first input node NIP. The second variable current source supplies the second variable current IV2a, which is a sink current, to the second input node NIN. The current control circuit variably controls the first variable current IV1a and the second variable current IV2a according to the voltage VLS of the first resistor node NMONP.

As described in FIG. 8, a mismatch between the first variable current IV1a and the second variable current IV2a causes a current detection error depending on the common mode voltage. As described in FIG. 9, a mismatch between the first constant current IC1a and the second constant current IC2a causes a current detection error independent of the common mode voltage. As described in FIG. 16, according to the embodiment, the correction circuit 121 can correct the current detection error caused by these mismatches.

In FIG. 2, the bipolar transistor BPA1 corresponds to the first constant current source, and the bipolar transistor BPA2 corresponds to the second constant current source. The bipolar transistor BPB1 corresponds to the first variable current source, and the bipolar transistor BPB2 corresponds to the second variable current source. The error amplifier circuit ERAM, the fifth resistor RLSM, and the bipolar transistors BPA3 and BPB3 correspond to the current control circuit.

5. Third Embodiment

Figure 17:
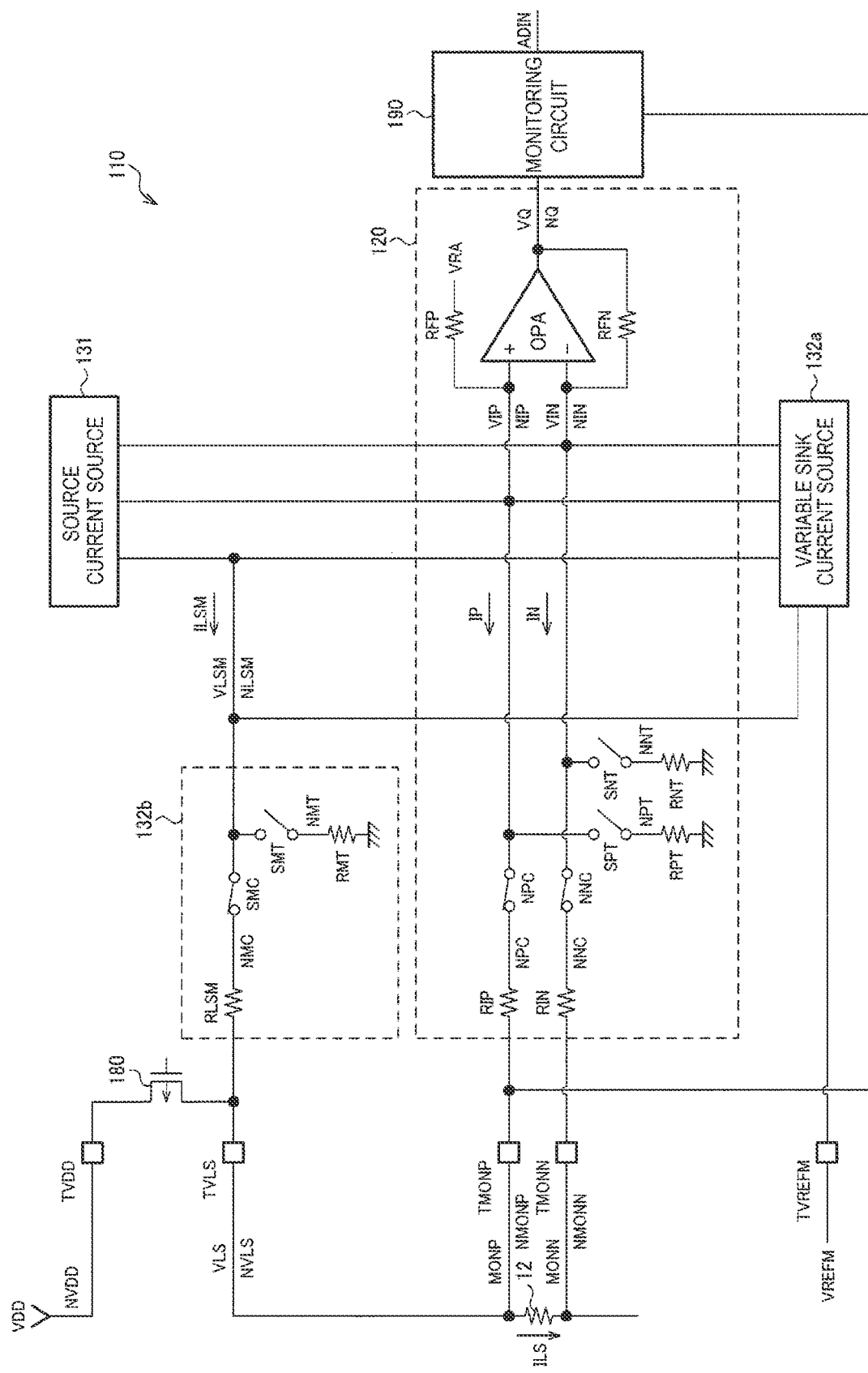
FIG. 17 shows a detailed configuration example of a current detection circuit according to a third embodiment.

FIG. 17 is a detailed configuration example of the current detection circuit 110 according to a third embodiment. In this configuration example, the current sense amplifier circuit 120 includes a monitoring circuit 190. Configurations and operations of the current sense amplifier circuit 120, the source current source 131, and the variable sink current sources 132a and 132b are the same as those of the first embodiment.

The monitoring circuit 190 switches an input voltage ADIN of the A/D conversion circuit 140. That is, the monitoring circuit 190 selects the detected voltage VQ as the input voltage ADIN in a current detection period and an offset detection period, and selects a monitor voltage VM based on the voltage MONP as the input voltage ADIN in a monitoring period.

Figure 18:
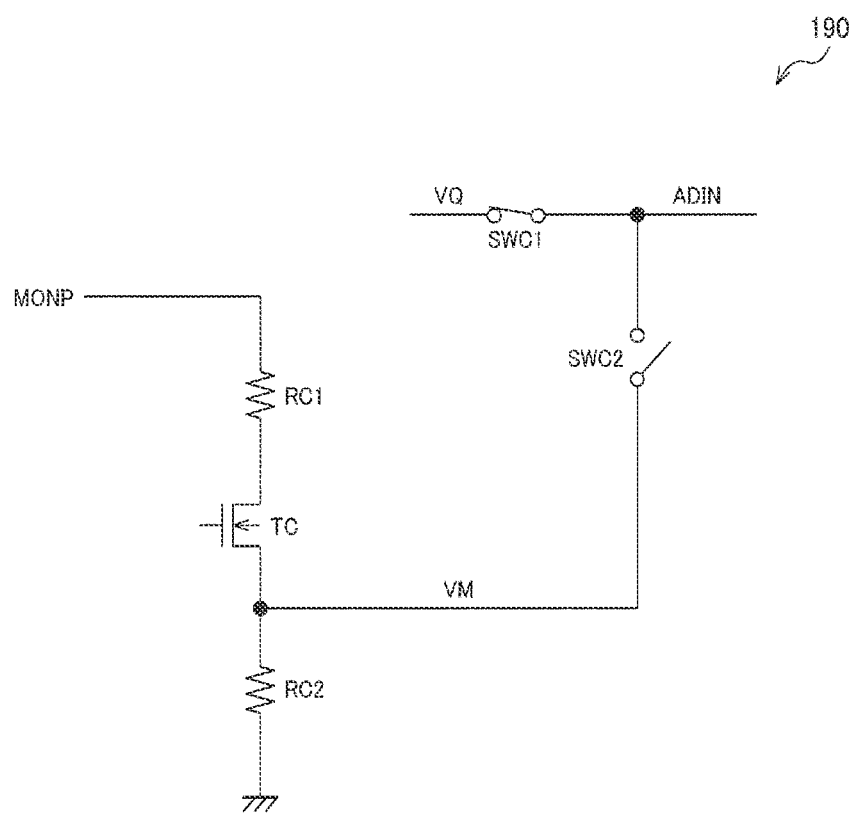
FIG. 18 shows a detailed configuration example of a monitoring circuit.

FIG. 18 is a detailed configuration example of the monitoring circuit 190. The monitoring circuit 190 includes resistors RC1 and RC2, an N-type transistor TC, and switches SWC1 and SWC2.

In the current detection period and the offset detection period, the control circuit 150 turns on the switch SWC1 and turns off the switch SWC2. Accordingly, the detected voltage VQ is output as the input voltage ADIN. In the monitoring period, the control circuit 150 turns on the N-type transistor TC and the switch SWC2, and turns off the switch SWC1. Accordingly, the voltage MONP is divided into the monitor voltage VM by the resistors RC1 and RC2, and the monitor voltage VM is output as the input voltage ADIN. When the voltage MONP is divided by the resistors RC1 and RC2, the monitor voltage VM is equal to or lower than a withstand voltage of circuit elements constituting the switches SWC1 and SWC2 and the A/D conversion circuit 140.

The control circuit 150 acquires the detected current value ICS in the current detection period, acquires the offset value IOST in the offset detection period, and acquires the monitor voltage VM based on the voltage MONP in the monitoring period. The control circuit 150 obtains the corrected current value ILScul by performing a calculation for correcting the detected current value ICS based on the offset value IOST, the monitor voltage VM, and a correction parameter stored in the storage circuit 170. Hereinafter, the correction parameter and a correction process will be described in detail.

Figure 19:
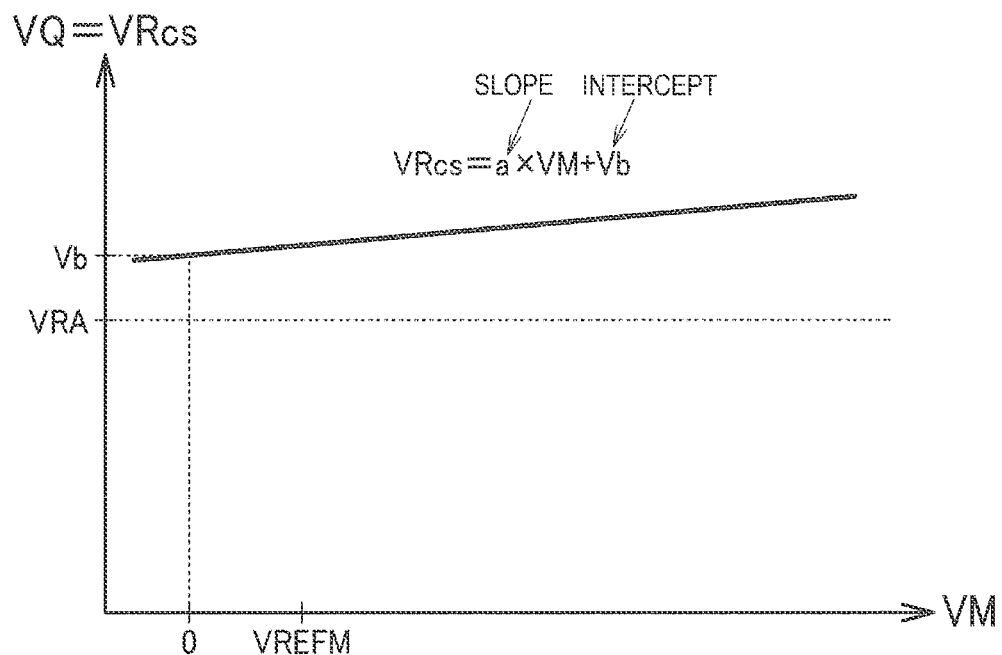
FIG. 19 is a schematic diagram of a correction parameter.
Figure 20:
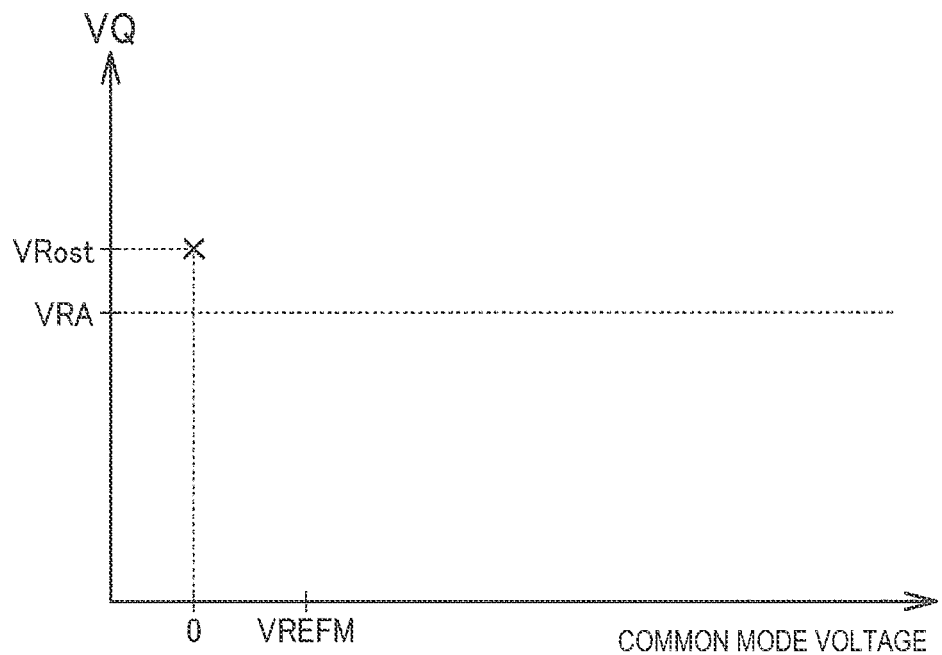
FIG. 20 is a schematic diagram of a correction parameter.

FIGS. 19 and 20 are schematic diagrams of the correction parameter. The correction parameter is acquired, for example, during inspection at the time of manufacturing. Hereinafter, an example in which the inspection apparatus executes a correction parameter acquisition process will be described.

FIG. 19 is a schematic diagram of a correction parameter for the detected current value ICS. The inspection apparatus short-circuits the both ends of the shunt resistor 12 and monitors the detection data ADQ while changing the voltage MONP. The inspection apparatus sets a switch state in the current detection period, and acquires data of the detected voltage VQ=VRcs while changing the voltage MONP. In addition, the inspection apparatus sets a switch state in the monitoring period, and acquires the monitor voltage VM while changing the voltage MONP. The inspection apparatus obtains a slope value a and an intercept value Vb of VRcs=a×VM+Vb from the acquired data, and sets them as the correction parameter.

FIG. 20 is a schematic diagram of a correction parameter for the offset value IOST. The inspection apparatus sets a switch state in the offset detection period, monitors the detection data ADQ, and acquires data of the detected voltage VQ=VRost. An offset value detected from a detected voltage VRost is referred to as a reference offset value. The inspection apparatus sets the VRost as the correction parameter.

The correction parameter is written into the storage circuit 170 from an external processing device or the like, for example, during the initialization at the time of power-on. Alternatively, the storage circuit 170 is a nonvolatile memory, and the correction parameter is stored in the nonvolatile memory at the time of manufacturing.

Next, a correction process using the correction parameter described above will be described. The control circuit 150 acquires the detected voltage VCS indicating the detected current value ICS in the current detection period, acquires the detected voltage VOST indicating the offset value IOST in the offset detection period, and acquires the monitor voltage VM based on the voltage MONP in the monitoring period. As shown in the following equation (21), the control circuit 150 obtains, using the correction parameter stored in the storage circuit 170, the voltage VQcul indicating the corrected current value ILScul.

$$VQcul=(VCS-VRcs)-(VOST-VRost)=\{VCS-(a \times VM+Vb)\}-(VOST-VRost) \qquad (21)$$

The third embodiment may be combined with the second embodiment. That is, when there is a residual error in the detected voltage VQ corrected according to the second embodiment, the residual error may be corrected by the correction process according to the third embodiment.

Figure 21:
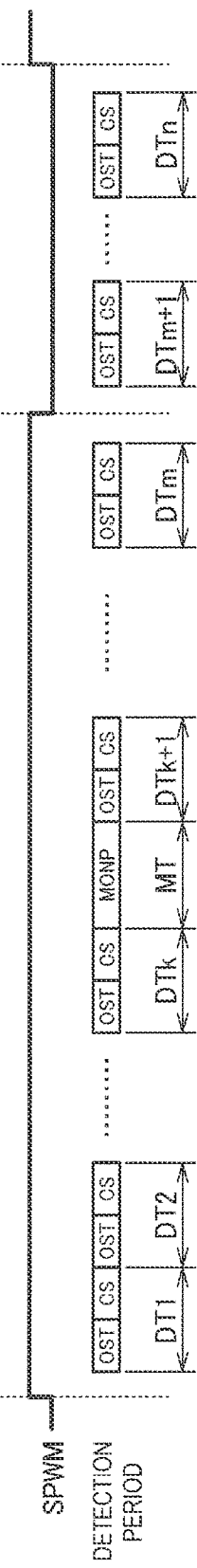
FIG. 21 is a first timing chart showing a current detection operation according to a third embodiment.

FIG. 21 is a first timing chart showing a current detection operation according to the third embodiment. The control circuit 150 changes the PWM signal SPWM from a low level to a high level, and performs operations from the first detection period DT1 to a k-th detection period DTk after a wait period elapses. The control circuit 150 performs an operation in the monitoring period MT, performs operations from a (k+1)-th detection period DTk to the m-th detection period DTm, and changes the PWM signal SPWM from the high level to the low level after the wait period elapses. The control circuit 150 performs operations in detection periods from an (m+1)-th detection period DTm+1 to an n-th detection period DTn after the wait period elapses, and changes the PWM signal SPWM from the low level to the high level after the wait period elapses. n is an integer of 3 or more, m is an integer of 2 or more and less than n, and k is an integer of 1 or more and less than m. For example, m is an even number, and k=m/2. A length of the monitoring period MT is, for example, the same as a length of one detection period, but is not limited thereto.

Figure 22:
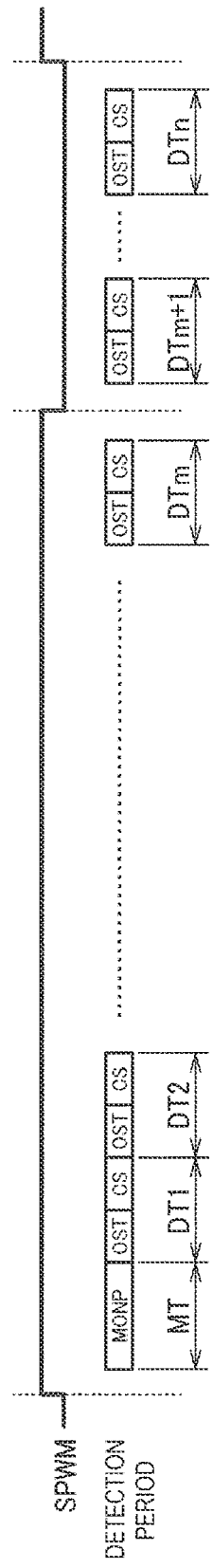
FIG. 22 is a second timing chart showing the current detection operation according to the third embodiment.

FIG. 22 is a second timing chart showing a current detection operation according to the third embodiment. The control circuit 150 performs the operation in the monitoring period MT before the first detection period DT1 after the PWM signal SPWM is changed from the low level to the high level. The monitoring period MT may be set within the wait period until the first detection period DT1 is started.

Figure 23:
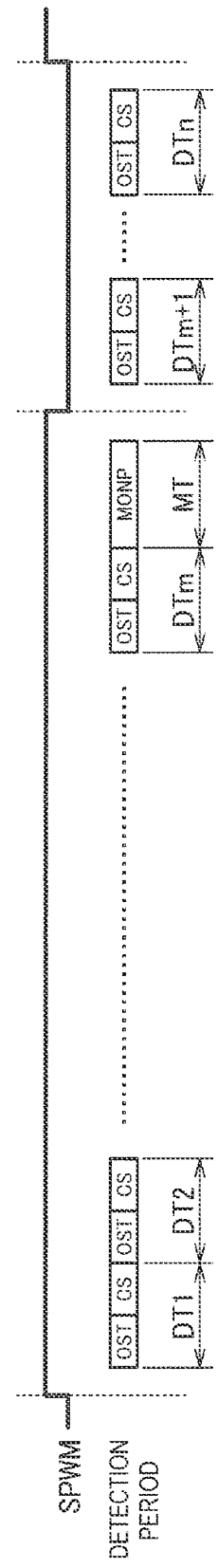
FIG. 23 is a third timing chart showing the current detection operation according to the third embodiment.

FIG. 23 is a third timing chart showing a current detection operation according to the third embodiment. The control circuit 150 performs the operations from the first detection period DT1 to the m-th detection period DTm, performs the operation in the monitoring period MT, and changes the PWM signal SPWM from the high level to the low level after the wait period elapses. The monitoring period MT may be set within the wait period until the PWM signal SPWM is changed from the high level to the low level.

The control circuit 150 obtains, based on the following equation (22), the voltage VQcul indicating the corrected current value ILScul. VMon is the monitor voltage acquired in the monitoring period MT shown in FIGS. 21 to 23, and is a monitor voltage in the ON period of the switching element 180. VMoff is a monitor voltage in the OFF period of the switching element 180, but the monitor voltage VMoff is not measured. Since MONP=−Vf, the voltage value of the monitor voltage VMoff obtained by dividing MONP=−Vf may be stored in the storage circuit 170, and the voltage value may be used in the following equation (22), where Vf is a forward voltage of the diode DA.

$$VQcul = \frac{1}{n}\left[\sum_{i=1}^{m}[\{VCSi-(a \times VM\text{ on}+Vb)\}-(VOSTi-VRost)] + \sum_{i=m+1}^{n}[\{VCSi-(a \times VM\text{ off}+Vb)\}-(VOSTi-VRost)]\right] \qquad (22)$$

As shown in the following equation (23), the control circuit 150 may calculate the voltage VQcul in consideration of an A/D gain ADG of the A/D conversion circuit 140. The A/D gain is measured during inspection or the like, and is stored in the storage circuit 170 as the correction parameter. In addition, a slope value a/ADG, an intercept value Vb/ADG, and a reference offset value VRost/ADG in which the A/D gain is corrected are stored in the storage circuit 170 as the correction parameter.

$$VQcul = \frac{1}{n}\left[ADG \times \sum_{i=1}^{m}\left[\left\{VCSi-\left(\frac{a}{ADG} \times VM\text{ on}+\frac{Vb}{ADG}\right)\right\} - \left(VOSTi-\frac{VRost}{ADG}\right)\right] + ADG \times \sum_{i=m+1}^{n}\left[\left\{VCSi-\left(\frac{a}{ADG} \times VM\text{ off}+\frac{Vb}{ADG}\right)\right\} - \left(VOSTi-\frac{VRost}{ADG}\right)\right]\right] \qquad (23)$$

The control circuit 150 may use a predetermined initial value VMonini for VMon in the above equation (22) or (23) in an initial ON period in which the switching element 180 is first turned on after power-on. In this case, the initial value VMonini is stored in the storage circuit 170 as the correction parameter.

In the embodiment described above, the circuit device 100 includes the current sense amplifier circuit 120, the level shift circuit 130, and the processing circuit 115. The switching element 180, the shunt resistor 12, and the inductor 11 are coupled in series between a first power supply node and a second power supply node. The current sense amplifier circuit 120 detects a current flowing through the shunt resistor 12. The processing circuit 115 obtains, based on an output of the current sense amplifier circuit 120, the corrected current value ILScul of the current ILS flowing through the shunt resistor 12. The current sense amplifier circuit 120 includes the operational amplifier OPA, the first resistor RIP, and the second resistor RIN. The first resistor RIP is provided between the first resistor node NMONP at one end of the shunt resistor 12 and the first input node NIP of the operational amplifier OPA. The second resistor RIN is provided between the second resistor node NMONN at the other end of the shunt resistor 12 and the second input node NIN of the operational amplifier OPA. The level shift circuit 130 level-shifts the voltages of the first input node NIP and the second input node NIN by supplying the first current IP to the first input node NIP and supplying the second current IN to the second input node NIN. The processing circuit 115 detects the detected current value ICS based on the output of the current sense amplifier circuit 120. The processing circuit 115 obtains the corrected current value ILScul by performing a calculation for correcting the detected current value ICS based on the monitor voltage VM, which is a result of monitoring the voltage MONP of the first resistor node NMONP.

According to the embodiment, when there is a mismatch between the first resistor RIP and the second resistor RIN or a mismatch between the first current IP and the second current IN, the mismatch causes a detection error of the current sense amplifier circuit 120. According to the embodiment, the processing circuit 115 performs the calculation for correcting the detected current value ICS, thereby correcting the detection error of the current sense amplifier circuit 120 caused by the at least one mismatch by the calculation. Accordingly, the current sense amplifier circuit 120 can accurately detect the current flowing through the shunt resistor 12.

In addition, as described in FIG. 19, there is a possibility that the detection error depends on the common mode voltage. According to the embodiment, the processing circuit 115 can correct the detection error depending on the common mode voltage by correcting the detected current value ICS based on the monitor voltage VM corresponding to the common mode voltage.

In the embodiment, the circuit device 100 includes the storage circuit 170 that stores the slope value and the intercept value of the detected current value ICS with respect to the monitor voltage VM. The processing circuit 115 performs a calculation for correcting the detected current value ICS based on the monitor voltage VM, the slope value, and the intercept value.

According to the embodiment, the slope value and the intercept value of the detected current value ICS with respect to the monitor voltage VM are the correction parameter indicating the detection error depending on the monitor voltage VM. The detection error depending on the monitor voltage VM is corrected by correcting the detected current value ICS based on the correction parameter.

In the example of FIG. 19, the slope value of the detected current value ICS corresponds to the slope value a of the detected voltage VQ=VRcs, and the intercept value of the detected current value ICS corresponds to the intercept value of the voltage VRcs. Since the current ILS flowing through the shunt resistor 12 is detected as the detected voltage VQ of the current sense amplifier circuit 120, correction of the detected current value ICS is equivalent to correction of the detected voltage VQ.

Further, in the embodiment, the processing circuit 115 performs the calculation for correcting the detected current value ICS acquired based on an output of the current sense amplifier circuit 120 in the current detection period based on the monitor voltage VM acquired in the monitoring period and the offset value IOST acquired based on the output of the current sense amplifier circuit 120 in the offset detection period, thereby obtaining the corrected current value ILScul.

According to the embodiment, the detected current value ICS is corrected based on the monitor voltage VM and the offset value IOST, whereby the detection error depending on the common mode voltage is corrected and the detection error caused by the offset is corrected.

In the embodiment, the circuit device 100 includes the storage circuit 170 that stores the reference offset value, and the slope value and the intercept value of the detected current value ICS with respect to the monitor voltage VM. The processing circuit 115 performs the calculation for correcting the detected current value ICS based on the monitor voltage VM, the slope value, the intercept value, and the reference offset value.

According to the embodiment, the detection error depending on the monitor voltage VM is corrected by correcting the detected current value ICS based on the monitor voltage VM, the slope value, and the intercept value. The detection error caused by the offset is corrected by correcting the detected current value ICS based on the reference offset value.

In the example of FIG. 20, the reference offset value corresponds to the detected voltage VQ=VRost. The reference offset value corresponds to the offset of the detected current value ICS, and the offset of the detected voltage VQ corresponding to the reference offset value is VRost.

In the embodiment, the detected voltage of the current sense amplifier circuit 120 acquired as the detected current value ICS is referred to as VCS, the slope value is referred to as a, the monitor voltage is referred to as VM, the intercept value is referred to as Vb, the detected voltage acquired as the offset value is referred to as VOST, the voltage corresponding to the reference offset value is referred to as VRost, and the voltage corresponding to the corrected current value ILScul is referred to as VQcul. As described in the above equation (21), VQcul={VCS−(a× VM+Vb)}−(VOST−VRost).

According to the embodiment, the voltage VQcul corresponding to the corrected current value ILScul can be calculated by the above calculation based on the slope value, the intercept value, and the reference offset value. Accordingly, the current detection error caused by the mismatch can be corrected by the calculation.

In the embodiment, the circuit device 100 includes the drive circuit 160 that drives the switching element 180 by the PWM signal SPWM based on the corrected current value ILScul. The processing circuit 115 acquires, in the detection periods from the first detection period DT1 to the m-th detection period DTm in the first voltage level period of the PWM signal SPWM, the detected current value ICS in the current detection period and the offset value IOST in the offset detection period.

In the embodiment, the processing circuit 115 acquires the monitor voltage VM in the monitoring period MT between the k-th detection period DTk and the (k+1)-th detection period DTk+1.

According to the embodiment, the monitor voltage VM can be acquired between the k-th detection period DTk and the (k+1)-th detection period DTk+1 in the first voltage level period of the PWM signal SPWM.

In the embodiment, the processing circuit 115 may acquire the monitor voltage VM in the monitoring period MT before the first detection period DT1.

According to the embodiment, the monitor voltage VM can be acquired before the first detection period DT1 in the first voltage level period of the PWM signal SPWM.

In the embodiment, the processing circuit 115 may acquire the monitor voltage VM in the monitoring period MT after the m-th detection period DTm.

According to the embodiment, the monitor voltage VM can be acquired after the m-th detection period DTm in the first voltage level period of the PWM signal SPWM.

6. Overview

The circuit device according to the embodiment described above includes a current sense amplifier circuit and a processing circuit. The current sense amplifier circuit detects a current flowing through a shunt resistor among a switching element, the shunt resistor and an inductor coupled in series between a first power supply node and a second power supply node. The processing circuit obtains, based on an output of the current sense amplifier circuit, a corrected current value of the current flowing through the shunt resistor. The current sense amplifier circuit includes an operational amplifier, a first resistor, a first switch, a second resistor, a second switch, a third resistor, a third switch, a fourth resistor, and a fourth switch. The first resistor is provided between a first resistor node at one end of the shunt resistor and a first node. The first switch is provided between the first node and a first input node of the operational amplifier. The second resistor is provided between a second resistor node at another end of the shunt resistor and a second node. The second switch is provided between the second node and a second input node of the operational amplifier. The third resistor is provided between a constant voltage node and a third node. The third switch is provided between the third node and the first input node of the operational amplifier. The fourth resistor is provided between the constant voltage node and a fourth node. The fourth switch is provided between the fourth node and the second input node of the operational amplifier. In the current detection period, the first switch and the second switch are turned on, the third switch and the fourth switch are turned off, and the processing circuit acquires a detected current value based on the output of the current sense amplifier circuit. In the offset detection period, the first switch and the second switch are turned off, the third switch and the fourth switch are turned on, and the processing circuit acquires an offset value based on the output of the current sense amplifier circuit. The processing circuit obtains a corrected current value based on the detected current value and the offset value.

According to the embodiment, since the third switch and the fourth switch are turned on in the offset detection period, the same state as a state where a differential input of the current sense amplifier circuit is short-circuited is formed. Accordingly, an offset of the current sense amplifier circuit can be measured. The first to fourth switches are coupled to an input node side of the operational amplifier with respect to the first resistor and the second resistor. Accordingly, a voltage at one end or the other end of the shunt resistor, which is a voltage near a power supply voltage or a negative voltage, is not directly applied to the four switches. Therefore, it is not necessary to make the switches have a process or a configuration that withstands a high voltage or a negative voltage.

In the embodiment, the circuit device may include a level shift circuit. The level shift circuit may level-shift voltages of the first input node and the second input node of the operational amplifier by supplying a first current to the first input node and supplying a second current to the second input node.

A common mode voltage of the input of the current sense amplifier circuit greatly fluctuates due to PWM driving. Without the level shift circuit, an input voltage of the operational amplifier also greatly fluctuates when the common mode voltage fluctuates. According to the embodiment, the level shift circuit level-shifts the voltages of the first input node and the second input node, thereby reducing fluctuation in the input voltage of the operational amplifier.

In the embodiment, the level shift circuit may level-shift the voltages of the first input node and the second input node of the operational amplifier by a variable level shift amount according to a voltage of the first resistor node by variably controlling the first current and the second current according to the voltage of the first resistor node.

According to the embodiment, the input voltage of the operational amplifier can be level-shifted by a level shift amount according to the common mode voltage. Accordingly, the input voltage of the operational amplifier is controlled according to the common mode voltage, and thus the fluctuation thereof is reduced.

In the embodiment, the level shift amount may be a difference between a reference voltage and the voltage of the first resistor node.

According to the embodiment, the input voltage of the operational amplifier can be level-shifted to a voltage substantially equal to the reference voltage. Accordingly, even when the common mode voltage fluctuates, the input voltage of the operational amplifier can be maintained at the voltage substantially equal to the reference voltage. Since the voltage applied to the first to fourth switches is the voltage substantially equal to the reference voltage, the first to fourth switches may have a process or a configuration that withstands the voltage substantially equal to the reference voltage.

In the embodiment, the circuit device may include a drive circuit configured to drive the switching element by a PWM signal based on the corrected current value. The processing circuit may acquire, in detection periods from a first detection period to an n-th detection period in one cycle of the PWM signal, the detected current value in the current detection period and the offset value in the offset detection period. n is an integer of 2 or more.

The current flowing through the shunt resistor fluctuates due to the PWM driving. According to the embodiment, an average current value can be obtained by performing the current detection a plurality of times in the one cycle of the PWM signal.

In the embodiment, the processing circuit may obtain, as the corrected current value in the one cycle, an average value of differences between the detected current value and the offset value acquired in the detection periods from the first detection period to the n-th detection period.

According to the embodiment, current values after offset cancellation in the detection periods are obtained based on the differences between the detected current value and the offset value, and the corrected current value in the one cycle is obtained based on the average value of the current values.

In the embodiment, detection periods from the first detection period to the n-th detection period may include detection periods from the first detection period to an m-th detection period in a first voltage level period of the PWM signal, and detection periods from an (m+1)-th detection period to the n-th detection period in a second voltage level period of the PWM signal. m is an integer of 1 or more and less than n. The processing circuit may obtain, as the corrected current value in the first voltage level period, an average value of differences between the detected current value and the offset value acquired in detection periods from the first detection period to the m-th detection period. The processing circuit may obtain, as the corrected current value in the second voltage level period, an average value of differences between the detected current value and the offset value acquired in detection periods from the (m+1)-th detection period to the n-th detection period. The processing circuit may obtain the corrected current value based on the corrected current value in the first voltage level period and the corrected current value in the second voltage level period.

The current flowing through the shunt resistor increases during an ON period of the switching element and decreases during an OFF period of the switching element. According to the embodiment, since the detection period is set for both the ON period and the OFF period of the switching element, the corrected current value in the one cycle can be accurately obtained.

In the embodiment, the switching element may be coupled between the first power supply node and the first resistor node, a diode may be coupled between the first resistor node and the second power supply node, the second power supply node being a ground node, and the inductor may be coupled between the second resistor node and the ground node. The current sense amplifier circuit may detect the detected current value by detecting a voltage difference between the first resistor node and the second resistor node.

The common mode voltage is near the power supply voltage of the first power supply node in the ON period of the switching element, and the common mode voltage is a negative voltage in the OFF period of the switching element. The negative voltage is a voltage lower than a ground voltage by a forward voltage of the diode. According to the embodiment, as described above, these voltages are not directly input to the first to fourth switches.

The solenoid control device according to the embodiment includes the circuit device described above, the switching element, the shunt resistor, and a solenoid that is the inductor. The solenoid is controlled based on a corrected current value.

Although the embodiment is described in detail as described above, it will be readily apparent to those skilled in the art that plural modifications may be made without departing substantially from novel matters and effects of the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of the embodiments and the modifications are also included in the scope of the present disclosure. Further, the configurations, operations, and so on of the current sense amplifier circuit, the level shift circuit, the current detection circuit, the inductor, the circuit device, the solenoid control device, and so on are not limited to those described in the embodiments, and various modifications can be made.

What is claimed is:

1. A circuit device comprising:
   a current sense amplifier circuit configured to detect a current flowing through a shunt resistor among a switching element, the shunt resistor and an inductor coupled in series between a first power supply node and a second power supply node; and
   a processing circuit configured to obtain, based on an output of the current sense amplifier circuit, a corrected current value of the current flowing through the shunt resistor, wherein
   the current sense amplifier circuit includes
      an operational amplifier,
      a first resistor provided between a first resistor node at one end of the shunt resistor and a first node,
      a first switch provided between the first node and a first input node of the operational amplifier,
      a second resistor provided between a second resistor node at another end of the shunt resistor and a second node,
      a second switch provided between the second node and a second input node of the operational amplifier,
      a third resistor provided between a constant voltage node and a third node,
      a third switch provided between the third node and the first input node of the operational amplifier,
      a fourth resistor provided between the constant voltage node and a fourth node, and
      a fourth switch provided between the fourth node and the second input node of the operational amplifier,
   in a current detection period, the first switch and the second switch are turned on, the third switch and the fourth switch are turned off, and the processing circuit acquires a detected current value based on the output of the current sense amplifier circuit,
   in an offset detection period, the first switch and the second switch are turned off, the third switch and the fourth switch are turned on, and the processing circuit acquires an offset value based on the output of the current sense amplifier circuit, and
   the processing circuit obtains the corrected current value based on the detected current value and the offset value.

2. The circuit device according to claim 1, further comprising:
   a level shift circuit configured to level-shift voltages of the first input node and the second input node of the operational amplifier by supplying a first current to the first input node and supplying a second current to the second input node.

3. The circuit device according to claim 2, wherein
   the level shift circuit level-shifts the voltages of the first input node and the second input node of the operational amplifier by a variable level shift amount according to a voltage of the first resistor node by variably controlling the first current and the second current according to the voltage of the first resistor node.

4. The circuit device according to claim 3, wherein
   the level shift amount is a difference between a reference voltage and the voltage of the first resistor node.

5. The circuit device according to claim 1, further comprising:
   a drive circuit configured to drive the switching element with a PWM signal based on the corrected current value, wherein
   the processing circuit acquires, in detection periods from a first detection period to an n-th detection period in one cycle of the PWM signal, n being an integer of 2 or more, the detected current value in the current detection period and the offset value in the offset detection period.

6. The circuit device according to claim 5, wherein
   the processing circuit obtains, as the corrected current value in the one cycle, an average value of differences between the detected current value and the offset value acquired in the detection periods from the first detection period to the n-th detection period.

7. The circuit device according to claim 5, wherein
   the detection periods from the first detection period to the n-th detection period include detection periods from the first detection period to an m-th detection period in a first voltage level period of the PWM signal, m being an integer of 1 or more and less than n, and detection periods from an (m+1)-th detection period to the n-th detection period in a second voltage level period of the PWM signal, and
   the processing circuit obtains, as the corrected current value in the first voltage level period, an average value of differences between the detected current value and the offset value acquired in periods from the first detection period to the m-th detection period, obtains, as the corrected current value in the second voltage level period, an average value of differences between the detected current value and the offset value acquired in periods from the (m+1)-th detection period to the n-th detection period, and obtains the corrected current value based on the corrected current value in the first voltage level period and the corrected current value in the second voltage level period.

8. The circuit device according to claim 1, wherein the switching element is coupled between the first power supply node and the first resistor node, a diode is coupled between the first resistor node and the second power supply node, the second power supply node being a ground node, and the inductor is coupled between the second resistor node and the ground node, and the current sense amplifier circuit detects the detected current value by detecting a voltage difference between the first resistor node and the second resistor node.

9. A solenoid control device comprising:

the circuit device according to claim 1;

the switching element;

the shunt resistor; and a solenoid that is the inductor, wherein the solenoid is controlled based on the corrected current value.

\* \* \* \* \*